United States Patent
Briffa et al.

(10) Patent No.: US 9,209,758 B2
(45) Date of Patent: *Dec. 8, 2015

(54) RF AMPLIFIER HAVING DISCRETE SUPPLY VOLTAGES

(71) Applicant: ETA Devices, Inc., Cambridge, MA (US)

(72) Inventors: Mark A. Briffa, Tyreso (SE); Joel L. Dawson, Roslindale, MA (US); John E. DeRoo, Atlanta, GA (US); Krenar Komoni, Waltham, MA (US); David J. Perreault, Andover, MA (US); Oguzhan Uyar, Cambridge, MA (US)

(73) Assignee: Eta Devices, Inc., Cambridge, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/666,965

(22) Filed: Mar. 24, 2015

(65) Prior Publication Data
US 2015/0194940 A1 Jul. 9, 2015

Related U.S. Application Data

(63) Continuation of application No. 14/338,671, filed on Jul. 23, 2014, now Pat. No. 9,020,453, which is a continuation of application No. 13/663,878, filed on Oct. 30, 2012, and a continuation of application No. 13/663,887, filed on Oct. 30, 2012, now Pat. No. 8,824,978.

(51) Int. Cl.
*H04B 1/04* (2006.01)
*H03F 1/02* (2006.01)
(Continued)

(52) U.S. Cl.
CPC ............... *H03F 3/19* (2013.01); *H03F 1/0216* (2013.01); *H03F 3/21* (2013.01); *H03G 3/3042* (2013.01);
(Continued)

(58) Field of Classification Search
CPC ............... H04B 1/04; H03F 1/04; H03F 1/02; H03F 3/68; H03F 1/025; H03F 3/60; H03F 3/20; H03F 3/21; H03F 1/0294; H03F 3/602; H03F 3/211; H03F 2203/21163
USPC .......... 455/127.3, 91, 102, 103, 114.1, 115.1, 455/115.2, 118, 126, 127.1, 127.2, 127.4; 375/296, 297; 330/124 R, 127, 129, 330/149
See application file for complete search history.

(56) References Cited

U.S. PATENT DOCUMENTS

| 4,129,839 A | 12/1978 | Galani et al. |
|---|---|---|
| 4,835,493 A | 5/1989 | Walsh, Jr. |

(Continued)

FOREIGN PATENT DOCUMENTS

| EP | 170 366 A2 | 2/2007 |
|---|---|---|
| EP | 170 366 A3 | 2/2007 |

(Continued)

OTHER PUBLICATIONS

Office Action dated Apr. 24, 2015; for U.S. Appl. No. 14/064,572 10 pages.

(Continued)

*Primary Examiner* — Pablo Tran
(74) *Attorney, Agent, or Firm* — Daly, Crowley, Mofford & Durkee, LLP

(57) ABSTRACT

A radio frequency (RF) power amplifier system or transmitter includes one or more power amplifiers and a controller that is configured to adjust amplitudes and phases of RF input signals of the one or more power amplifiers and supply voltages applied to the one or more power amplifiers. In embodiments where multiple power amplifiers are used, a combiner may be provided to combine outputs of the power amplifiers.

25 Claims, 21 Drawing Sheets

(51) Int. Cl.
*H03F 3/68* (2006.01)
*H03F 3/19* (2006.01)
*H03G 3/30* (2006.01)
*H03F 3/21* (2006.01)

(52) U.S. Cl.
CPC ........ *H04B 1/0483* (2013.01); *H03F 2200/451* (2013.01); *H03F 2200/504* (2013.01); *H03F 2203/21106* (2013.01); *H04B 2001/045* (2013.01)

(56) References Cited

U.S. PATENT DOCUMENTS

| | | | |
|---|---|---|---|
| 5,012,200 A | 4/1991 | Meinzer | |
| 5,561,395 A | 10/1996 | Melton et al. | |
| 5,847,602 A | 12/1998 | Su | |
| 5,892,395 A * | 4/1999 | Stengel et al. | 330/124 R |
| 6,043,707 A | 3/2000 | Budnik | |
| 6,081,161 A | 6/2000 | Dacus et al. | |
| 6,133,788 A * | 10/2000 | Dent | 330/124 R |
| 6,140,807 A | 10/2000 | Vannatta et al. | |
| 6,255,906 B1 * | 7/2001 | Eidson et al. | 330/124 R |
| 6,327,462 B1 | 12/2001 | Loke et al. | |
| 6,377,117 B2 * | 4/2002 | Oskowsky et al. | 330/51 |
| 6,396,341 B1 | 5/2002 | Pehlke | |
| 6,449,465 B1 | 9/2002 | Gailus et al. | |
| 6,535,066 B1 | 3/2003 | Petsko | |
| 6,566,944 B1 | 5/2003 | Pehlke et al. | |
| 6,738,432 B2 * | 5/2004 | Pehlke et al. | 375/300 |
| 6,788,151 B2 | 9/2004 | Shvarts et al. | |
| 6,799,020 B1 | 9/2004 | Heidmann et al. | |
| 6,975,166 B2 | 12/2005 | Grillo et al. | |
| 7,068,984 B2 | 6/2006 | Mathe et al. | |
| 7,091,772 B2 | 8/2006 | Friedel et al. | |
| 7,103,114 B1 * | 9/2006 | Lapierre | 375/318 |
| 7,236,542 B2 | 6/2007 | Matero | |
| 7,279,971 B2 | 10/2007 | Hellberg et al. | |
| 7,330,070 B2 | 2/2008 | Vaisanen | |
| 7,362,251 B2 | 4/2008 | Jensen et al. | |
| 7,411,449 B2 | 8/2008 | Klingberg et al. | |
| 7,423,477 B2 | 9/2008 | Sorrells et al. | |
| 7,440,733 B2 | 10/2008 | Maslennikov et al. | |
| 7,469,017 B2 | 12/2008 | Granstrom et al. | |
| 7,474,149 B2 | 1/2009 | Snelgrove et al. | |
| 7,482,869 B2 | 1/2009 | Wilson | |
| 7,505,747 B2 | 3/2009 | Solum | |
| 7,512,387 B2 | 3/2009 | Glueck | |
| 7,535,133 B2 | 5/2009 | Perreault et al. | |
| 7,555,059 B2 | 6/2009 | Rybicki et al. | |
| 7,583,149 B2 | 9/2009 | Funaki et al. | |
| 7,589,605 B2 | 9/2009 | Perreault et al. | |
| 7,705,681 B2 * | 4/2010 | Ilkov | 330/295 |
| 7,715,811 B2 | 5/2010 | Kenington | |
| 7,889,519 B2 | 2/2011 | Perreault et al. | |
| 7,956,572 B2 | 6/2011 | Zane et al. | |
| 7,962,111 B2 | 6/2011 | Solum | |
| 8,009,765 B2 | 8/2011 | Ahmed et al. | |
| 8,026,763 B2 | 9/2011 | Dawson et al. | |
| 8,072,264 B2 | 12/2011 | Gustavsson | |
| 8,155,237 B2 | 4/2012 | Ahmed | |
| 8,164,384 B2 | 4/2012 | Dawson et al. | |
| 8,174,322 B2 | 5/2012 | Heijden et al. | |
| 8,212,541 B2 | 7/2012 | Perreault et al. | |
| 8,315,578 B2 | 11/2012 | Zhu et al. | |
| 8,340,606 B2 | 12/2012 | Park et al. | |
| 8,416,018 B2 | 4/2013 | Yamauchi et al. | |
| 8,447,245 B2 | 5/2013 | Staudinger et al. | |
| 8,451,053 B2 | 5/2013 | Perreault et al. | |
| 8,493,142 B2 | 7/2013 | Tadano | |
| 8,536,940 B2 | 9/2013 | Bohn et al. | |
| 8,542,061 B2 | 9/2013 | Levesque et al. | |
| 8,610,499 B2 | 12/2013 | Royer | |
| 8,611,459 B2 | 12/2013 | McCallister | |
| 8,659,353 B2 * | 2/2014 | Dawson et al. | 330/124 R |
| 8,718,188 B2 | 5/2014 | Balteanu et al. | |
| 8,773,201 B2 | 7/2014 | Yamamoto et al. | |
| 8,995,502 B1 | 3/2015 | Lai et al. | |
| 2003/0146791 A1 | 8/2003 | Shvarts et al. | |
| 2004/0100323 A1 | 5/2004 | Khanifar et al. | |
| 2004/0251964 A1 | 12/2004 | Weldon | |
| 2005/0062529 A1 | 3/2005 | Gan et al. | |
| 2005/0191975 A1 | 9/2005 | Talwalkar et al. | |
| 2005/0191976 A1 | 9/2005 | Shakeshaft et al. | |
| 2005/0248401 A1 | 11/2005 | Hellberg et al. | |
| 2007/0066224 A1 * | 3/2007 | d'Hont et al. | 455/41.2 |
| 2007/0066250 A1 | 3/2007 | Takahashi et al. | |
| 2007/0069818 A1 | 3/2007 | Bhatti et al. | |
| 2007/0123184 A1 | 5/2007 | Nesimoglu et al. | |
| 2007/0146090 A1 | 6/2007 | Carey et al. | |
| 2007/0159257 A1 | 7/2007 | Lee et al. | |
| 2007/0247222 A1 | 10/2007 | Sorrells et al. | |
| 2007/0247253 A1 * | 10/2007 | Carey et al. | 332/112 |
| 2007/0281635 A1 * | 12/2007 | McCallister et al. | 455/126 |
| 2007/0290747 A1 * | 12/2007 | Traylor et al. | 330/133 |
| 2007/0291718 A1 | 12/2007 | Chan et al. | |
| 2008/0001660 A1 | 1/2008 | Rasmussen | |
| 2008/0003960 A1 * | 1/2008 | Zolfaghari | 455/127.3 |
| 2008/0003962 A1 | 1/2008 | Ngai | |
| 2008/0007333 A1 | 1/2008 | Lee et al. | |
| 2008/0012637 A1 * | 1/2008 | Aridas et al. | 330/129 |
| 2008/0019459 A1 * | 1/2008 | Chen et al. | 375/297 |
| 2008/0085684 A1 | 4/2008 | Phillips et al. | |
| 2008/0146171 A1 | 6/2008 | Hellberg et al. | |
| 2008/0297246 A1 | 12/2008 | Taylor | |
| 2010/0073084 A1 * | 3/2010 | Hur et al. | 330/124 R |
| 2010/0120384 A1 | 5/2010 | Pennec | |
| 2010/0201441 A1 | 8/2010 | Gustavsson | |
| 2011/0135035 A1 | 6/2011 | Bose et al. | |
| 2011/0156815 A1 | 6/2011 | Kim et al. | |
| 2011/0309679 A1 | 12/2011 | Fisher et al. | |
| 2012/0176195 A1 | 7/2012 | Dawson et al. | |
| 2012/0235736 A1 | 9/2012 | Levesque et al. | |
| 2012/0252382 A1 | 10/2012 | Bashir et al. | |
| 2012/0256686 A1 | 10/2012 | Royer | |
| 2012/0313602 A1 | 12/2012 | Perreault et al. | |
| 2012/0326684 A1 | 12/2012 | Perreault et al. | |
| 2013/0241625 A1 | 9/2013 | Perreault et al. | |
| 2013/0251066 A1 | 9/2013 | Kim et al. | |
| 2013/0307618 A1 | 11/2013 | Anvari | |
| 2013/0343106 A1 | 12/2013 | Perreault et al. | |
| 2013/0343107 A1 | 12/2013 | Perreault | |
| 2014/0118063 A1 | 5/2014 | Briffa et al. | |
| 2014/0118065 A1 | 5/2014 | Briffa et al. | |
| 2014/0118072 A1 | 5/2014 | Briffa et al. | |
| 2014/0120854 A1 | 5/2014 | Briffa et al. | |
| 2014/0125412 A1 | 5/2014 | Dawson et al. | |
| 2014/0132354 A1 | 5/2014 | Briffa et al. | |
| 2014/0167513 A1 | 6/2014 | Chang et al. | |
| 2014/0225581 A1 | 8/2014 | Giuliano et al. | |
| 2014/0226378 A1 | 8/2014 | Perreault | |
| 2014/0335805 A1 | 11/2014 | Briffa et al. | |

FOREIGN PATENT DOCUMENTS

| | | |
|---|---|---|
| EP | 1 809 239 B1 | 7/2010 |
| WO | WO 2005/106613 A1 | 11/2006 |
| WO | WO 2006/119362 A2 | 11/2006 |
| WO | WO 2007/082000 A2 | 7/2007 |
| WO | WO 2007/094921 A1 | 8/2007 |
| WO | WO 2007/136919 A2 | 11/2007 |
| WO | WO 2007/136919 A3 | 11/2007 |
| WO | WO 2009/153218 A1 | 12/2009 |
| WO | WO 2010/056646 A1 | 5/2010 |
| WO | WO 2011/097387 A1 | 8/2011 |
| WO | WO 2013/109719 A1 | 7/2013 |
| WO | WO 2013/109743 A2 | 7/2013 |
| WO | WO 2013/109797 A1 | 7/2013 |
| WO | WO 2013/134573 A1 | 9/2013 |
| WO | WO 2013/191757 A1 | 12/2013 |
| WO | WO 2014/004241 A2 | 1/2014 |
| WO | WO 2014/028441 A2 | 2/2014 |
| WO | WO 2014/070474 A1 | 5/2014 |

(56) References Cited

FOREIGN PATENT DOCUMENTS

| WO | WO 2014/070475 A1 | 5/2014 |
|---|---|---|
| WO | WO 2014/070996 A1 | 5/2014 |
| WO | WO 2014/088097 A1 | 6/2014 |

OTHER PUBLICATIONS

U.S. Appl. No. 14/619,737, filed Feb. 11, 2015, Perreault, et al.
Notice of Allowance dated Aug. 13, 2015; for U.S. Appl. No. 13/663,878; 13 pages.
Office Action dated Jul. 8, 2015 for U.S. Appl. No. 13/955,952; 13 pages.
Response filed on Mar. 10, 2015; to an Office Acton dated Feb. 23, 2015; U.S. Appl. No. 14/064,572; 3 pages.
Response filed on May 26, 2015; to an Office Action dated Jan. 26, 2015; U.S. Appl. No. 13/955,952; 11 pages.
Office Action dated Jun. 2, 2015; for U.S. Appl. No. 13/663,878; 18 pages.
Response flied on Jul. 17, 2015 to a Non-Final Office Action dated Apr. 24, 2015, for U.S. Appl. No. 14/064,572; 9 pages.
Response filed on Jul. 21, 2015 to a Final Office Action dated Jun. 2, 2015, for U.S. Appl. No. 13/663,878; 13 pages.
Office Action dated May 7, 2015 for U.S. Appl. No. 13/663,878, flied on Oct. 30, 2012.
PCT International preliminary Report on Patentability for Appl. No. PCT/US2013/06552 dated May 14, 2015.
PCT International Preliminary Report on Patentability for Appl. No. PCT/US2013/06553 dated May 14, 2015.
Notice of Allowance dated Aug. 3, 2015, for U.S. Appl. No. 14/064,572; 13 pages.
Notice of Allowance dated Jul. 29, 2015, for U.S. Appl. No. 13/955,952; 11 pages.
PCT International Preliminary Report on Patentability and Written Opinion of the ISA dated Jun. 2, 2015; for PCT Pat. App. No. PCT/US2013/070027; 12 pages.
U.S. Appl. No. 14/758,033, filed Jun. 26, 2015, Perreault, et al.
U.S. Appl. No. 14/791,685, filed Jul. 6, 2015, Perreault, et al.
U.S. Appl. No. 14/035,445, filed Sep. 24, 2013, Perreault.
Sungwon Chung, et al., "Asymmetric Multilevel Outphaelng Architecture for Multi-Standard Transmitters", 2009 IEEE Radio Frequency Integrated Circuits Symposium, pp. 237-240.
D. Diaz, et al., "Comparison of Two Different Cell Topologies for a Multilevel Power Supply to Achieve High Efficiency Envelope Amplifier", IEEE , 2009, pp. 25-30.
M. Rodriguez, et al, "Multilevel Converter for Envelope Tracking in RF Power Amplifiers", IEEE, 2009, pp. 503-510.
Yuan-Jyue Chen, et al., "Multilevel LINC System Design for Wireless Transmitters", IEEE. 2007, pp- 1-4.
Jinsung Choi, et al., "A ΔΣ—Digitized Polar RF Transmitter", IEEE Transactions on Microwave Theory and Techniques, vol. 66, No. 12, Dec. 2007, pp. 2679-2690.
Kai-Yuan Jheng, et al., "Multilevel LINC System Design for Power Efficiency Enhancement", IEEE, 2007, pp. 31-34.
Kevin Tom, et al., "Load-Pull Analysis of Outphasing Class-E Power Amplifier", The 2$^{nd}$ International Conference on Wireless Broadband and Ultra Wideband Communications (AusWirelees 2007), IEEE, 2007, pp. 1-4.
Surya Musunuri, et al., "Improvement of Light-Load Efficiency Using Width-Switohtng Scheme for CMOS Transistors", IEEE Power Electronics Letters, vol. 3, No. 3, Sep. 2005, pp. 105-110.
Frederick H, Raab, et al., "RF and Microwave Power Amplifier and Transmitter Technologies—Part 3", Sep. 2003, High Frequency Electronics, Summit Technical Media, LLC., pp. 34-48.
Petri Eloranta, et al., "A Multimode Transmitter in 0.13 μm CMOS Using Direct-Digital RF Modulator", IEEE Journal of Solid-State Circuits, vol. 42, No. 12, Dec. 2007, pp. 2774-2784.
Invitation to Pay Additional Fees in PCT/U82009/063821 dated Feb. 9, 2010.
PCT Search Report of the ISA dated Apr. 13, 2010.
PCT Written Opinion of the ISA dated Apr. 13, 2010.

International Preliminary Report on Patentability of the ISA for PCT/US2009/083821 dated May 26, 2011.
Amendment to Office Action mailed Apr. 7, 2011 (U.S. Appl. No. 12/680,048, filed Mar. 25, 2010).
Response to Rule 151 communication dated Jun. 28, 2011; Jan. 9, 2012.
Image File Wrapper downloaded on Nov. 2, 2012 for U.S. Appl. No. 12/616.696, filed Nov. 10, 2009; 427 pages.
Image File Wrapper downloaded on Nov. 2, 2012 for U.S. Appl. No. 13/106,196, filed May 12, 2011; Part 1 of 2, 291 pages.
Image File Wrapper downloaded on Nov. 2, 2012 for U.S. Appl. No. 13/106,196, filed Jun. 12, 2011; Part 2 of 2, 238 pages.
image File Wrapper downloaded on Nov. 2, 2012 for U.S. Appl. No. 13/423,909, filed Mar. 19, 2012; Part 1 of 3, 300 pages.
Image File Wrapper downloaded on Nov. 2, 2012 for U.S. Appl. No. 13/423.900, filed Mar. 19, 2012; Part 2 of 3, 360 pages.
Image File Wrapper downloaded on Nov. 2, 2012 for U.S. Appl. No. 13/423,909, filed Mar. 19, 2012; Part 3 of 3, 397 pages.
Beltran, et al.; "HF Outphasing Transmitter Using Class-E Power Amplifiers;" Microwave Symposium Digest, IEEE; Jun. 2009; pp. 757-760.
Bifrane, et al.; "On the Lineatly and Efficiency of Outphasing Microwave Amplifiers;" IEEE Transactions on Microwave Theory and Techniques; vol. 62; No. 7; Jul. 2004; pp. 1702-1708.
Chen, et al.; "A High Efficiency OutphasIng Transmitter Structure for Wireless Communications;" Digital Signal Processing Workshop, IEEE; Jan. 2009, pp. 348-352.
Chirebc, "High Power Outphasing Modulation;" Proceedings of the Institute of Radio Engineers; vol. 23; No. 11; Nov. 1935; pp. 1370-1392.
Cox; "Linear Amplification with Nonlinear Components;" IEEE Transactions on Communications; Dec. 1974; pp. 1942-1945.
El-Hernemay; "Design of High-Efficiency RF Class-D Power Amplifier; " IEEE Transactions on Power Electronics; vol. 9; No. 3; May 1994; pp. 297-308.
Eun, et al.; "A High Linearity Chirolx Outphasing Power Amplifier Using Composite Right/Left-Hended Transmission Lines;" Proceedings of the 37$^{th}$ European Microwave Conference; Oct. 2007; pp. 1622-1625.
Everitt, et al.; "Communication Engineering; " 3$^{rd}$ Edition, Chapter 11, pp. 403-450, New York: McGraw-Hill, 1956.
Gerhard, et al.; "Improved Design of Outphasing Power Amplifier Combiners;" 2009 German Microwave Conference; Mar. 2009: pp. 1-4.
Godoy, et al.; "OutphasIng Energy Recovery Amplifier With Resistance Compression for Improved Efficiency;" IEEE Transactions on Microwave Theory and Techniques; vol. 57; No, 12; Dec. 2009; pp. 2895-2906.
Hakela, et al., "A 2.14-GHz Chlrelx Outphasing Transmitter," IEEE Transactions on Microwave Theory and Techniques; vol. 53; No. 6; Jun. 2005; pp. 2129-2138.
Hakala, et el.; Chirelx Power Combining with Saturated Class-B Power Amplifiers; 12$^{th}$ GAAS Symposium; Oct. 2004, pp. 378-382.
Hamill; "Impedance Plan Analysts of Class DE Amplifier;" Electronics Letters; vol. 30; No. 23; Nov. 10, 1994; pp. 1906-1908.
Hamill; "Time Reversal Duality Between Linear Networks;" IEEE Transactions on Circuits and Systems-1: Fundamental Theory end Applications; vol. 43; No. 1; Jan. 1998; pp. 63-65.
Hamill; "Time Reversal Duality in Dc-Dc Converters;" Power Electronics Specialists Conference, IEEE; vol. 1; Jun. 1997; 7 pages.
Han, et al.; "Analysis and Design of High Efficiency Matching Networks;" IEEE Transactions on Power Electronics; vol. 21; No. 6, Sep. 2008; pp. 1484-1491.
Han, et al.; "Resistance Compression Networks for Radio-Frequency Power Conversion;" IEEE Transactions on Power Electronics; vol. 22; No. 1; Jan. 2007; pp. 41-53.
Honjo; "A Simple Circuit Synthesis Method for Microwave Class-F Ultra-High-Efficiency Amplifiers with Reactance-Compensation Circuits;" Solid-State Electronics 44; Feb. 2000; pp. 1477-1482.
Hur, et al.; "A Multi-Level and Multi-Band Class-D CMOS Power Amplifier for the LINC System in the Cognitive Radio Application;" IEEE Microwave and Wireless Components Letters; vol. 20; Issue 6; Jun. 2010; pp. 1-3.

(56) References Cited

OTHER PUBLICATIONS

Hur, et al.; "Highly Efficient and Linear Level Shifting Digital LINC Transmitter with a Phase Offset Cancellation;" Radio & Wireless Symposium; Jan. 2009; pp. 211-214.

Hur, et al.; "Highly Efficient Uneven Multi-Level LINC Transmitter:" Electronics Letters; Jul. 30, 2009; vol. 45; No. 16; 2 pages.

Kee, et al.; "The Class-E/F Family of ZVS Switching Amplifiers;" IEEE Transactions on Microwave Theory and Techniques; vol. 81; No, 6; Jun. 2003; pp. 1677-1690.

Kruass, et al.; Solid State Radio Engineering; Chapter 14, New York: Wiley, 1980.

Langridge, et al.; "A Power Re-Use Technique for Improved Efficiency of Outphasing Microwave Power Amplifiers;" IEEE Transactions on Microwave Theory and Techniques; vol. 47; No. 8; Aug. 1999; pp. 1487-1470.

Lee; Planer, "Microwave Engineering;" Chapter 20, pp. 630-087, New York: Cambridge University Press, 2004.

Lepine, et al.; "L-Band LDMOS Power Amplifiers Based on an Inverse Class-F Architecture;" IEEE , Transactions on Microwave Theory and Techniques; vol. 53; No. 6; Jun. 2005; pp. 2007-2012.

Ni, et al.; "A New Impedance Match Method in Serial Chirelx Combiner;" 2008 Asla-Pacffic Microwave Conference; Dec. 2008; pp. 1-4.

Perreault; A New Power Combining and Outphasing Modulation System for High-Efficiency Power Amplification; Ciroulta and Systems (MWSCAS), $53^{rd}$ IEEE, International Midwest Symposium; Aug. 2010; pp. 1-14.

Phinney, et al.; "Radiofrequency Inverters with Transmission-Line Input Networks;" IEEE Transactions on Power Electronics; vol. 22; No. 4; Jul. 2007; pp. 1154-1161.

Qureshi, et al.; "A 90-W Peak Power GaN Outproolng Amplifier with Optimum input Stgnal Conditioning:" IEEE Transactions on Microwave Theory and Techniques; vol. 57; No. 8; Aug. 2009; pp. 1925-1936.

Raab; "Class-F Power Amplifiers with Maximally Flat Waveforms;" IEEE Transactions on Microwave Theory and Techniques; vol. 45; No. 11; Nov. 1997; pp. 2007-2012.

Raab; "Efficiency of OutphasIng RF Power-Amplifier Systems;" IEEE Transactions on Communications; vol. Com-33; No. 10; Oct. 1985; pp. 1094-1099.

Raab, at al.; "RF and Microwave Power Amplifier and Transmitter Technologies—Part 3;" High Frequency Electronics; Sep. 2003; pp. 34-48.

Rivas, et al.; "A High-Frequency Resonant Inverter Topology with Low-Voltage Stress;" IEEE Transactions on Power Electronics; vol. 23; No. 4; Jul. 2008; pp. 1759-1771.

Sakai, et al.; "Class E—A New Class of High-Efficiency Tuned Single-Ended Switching Power Amplifiers;" IEEE Journal of Solid-State Circuits; vol. SC-10; No. 3; Jun. 1976; pp. 168-178.

Sokal; "Class-E RF Power Amplifiers;" QEX Jan./Feb. 2001; pp. 8-20.

Yeo, et al.; "Power Amplifier Selection far LINC Applications;" IEEE Transactions on Circuits and Systems-II: Express Briefs; vol. 53; No. 8; Aug. 2008; pp. 763-767.

Zheng, at el.; "Analysis of Power Recycling Techniques for RF and Microwave Outphasing Power Amplifiers;" IEEE Transactions on Circuits and Systems-II: Analog and Digital Signal Processing; vol. 49; No. 6; May 2002; pp. 312-320.

Zhou, et al.; "A Distributed Active Transformer Coupled Outphasing Power Combiner;" IEEE Microwave Conference; Dec. 2009; pp. 2566-2888.

Zhukov, et al.; "Push-pull switching oscillator without commutating losses;" *Poluprovodn/kovye Pribory* v. *Tekhnlke Elektroavyazl*, No. 15, Jan. 1975, 8 pages.

Xu, at al.; "A 28.1DbM class-D outphasing power amplifier in 45nm LP digital CMOS;" Symposium on VLSI Circuits Digest of Technical Papers; Jun. 16, 2009; pp. 206-207.

Zhou, et al.; "A Distributed Active Transformer Coupled Outphasing Power Combiner;" Microwave Conference, IEEE; Dec. 7, 2000; pp. 2566-2588.

PCT Search Report of the ISA for PCT/US2011/023613 dated May30, 2011.

Written Opinion of the ISA for PCT/US2011/023613 dated May 30, 2011.

International Preliminary Report on Patentability of the ISA for PCT/US2011/023813 dated Aug. 16, 2012.

Image File Wrapper downloaded on Nov. 2, 2012 for U.S. Appl. No. 13/020,588, filed Feb. 3, 2011; part 1 of 2, 335 pages.

Image File Wrapper downloaded on Nov. 2, 2012 for U.S. Appl. No. 13/020,558, filed Feb. 3, 2011; part 2 of 3, 100 pages.

Image File Wrapper downloaded on Nov. 2, 2012 for U.S. Appl. No. 13/020,588, filed Feb. 3, 2011; part 3 of 3, 244 pages.

Cripps; "RF Power Amplifier for Wireless Communications, $2^{nd}$ Ed.;" Chapter 14, Artech House, Boston, MA; Jan. 2006.

Godoy, at al.; "A 2.4-GHz, 27-dBm Asymmetric Multilevel Outphasing Power Amplifier in 65-nm CMOS;" IEEE Journal of Solid-State Circuits; vol. 47; No. 10; Oct. 2012; pp. 2372-2384.

Raab; "Average Efficiency of Clasa-G Power Amplifiers;" IEEE Transactions on Consumer Electronics; vol. CE-32; No. 2; May 1988; pp. 145-150.

Shirvani, et al.; "A CMOS RF Power Amplifier With Parallel Amplification for Efficient Power Control;" IEEE Journal of Solid-State Circuits; vol. 37; No. 6; Jun. 2002; pp. 684-693.

Vaslc, et al.; "Multilevel Power Supply for High Efficiency RF Amplifiers;" 2009 IEEE Applied Power Electronics Conference; pp. 1233-1238; Feb. 2009.

Walling, et al.; "A Class-G Supply Modulator and Class-E PA in 130 nm CMOS;" IEEE Journal of Solid-State Circuits; vol. 44; No. 9; Sep. 2009; pp. 2339-2347.

Yan, et al.; "A High Efficiency 780 MHz GaN Envelope Tracking Power Arnpilfier;" 2012 Compound Semiconductor Integrated Circuits Syumposium; Oct. 2012; pp. 1-4.

Yousafzadah, et al.; "Three-Level Buck Converter for Envelope Tracking Applications;" IEEE Transactions on Power Electronics: vol. 21; No. 2; Mar. 2006; pp. 549-552.

Heijden, et al.; "A 19W High-Efficiency Wide-Band CMOS-GaN Class-E Chlraix RF Outphasing Power Amplifier" Microwave Symposium Digest (MMT), 2011 IEEE MTT-S International; Jun. 5-10, 2011; 4 pages.

PCT Search Report of the ISA for PCT/U82013/065662 dated Mar. 20, 2014.

Written Opinion of the ISA for PCT/US2013/085552 dated Mar. 20. 2014.

PCT Search Report of the ISA for PCT/US2013/085553 dated Mar. 20, 2014.

Written Opinion of the ISA for PCT/US2013/065663 dated Mar. 20, 2014.

Notice of Allowance for Patent Application No. 13/883,887, filed on Oct. 30, 2012.

PCT Search Report of the ISA for PCT/US2013/70027 dated Apr. 22. 2014.

PCT Written Opinion of the ISA for PCT/U82013/70027 dated Apr. 22, 2014.

Office Action dated May 23, 2014 from U.S. Appl. No. 13/683,878, filed Oct. 30, 2012.

Response to Office Action dated May 23, 2014 as filed on Jul. 31, 2014 from U.S. Appl. No. 13/663,878, filed Oct. 30, 2012.

Image File Wrapper downloaded on Aug. 6, 2014 for U.S. Appl. No. 13/683,887, filed Oct. 30, 2012; Part 1 of 17; 275 pages.

Image File Wrapper downloaded on Aug. 6, 2014 for U.S. Appl. No. 13/663,687, filed Oct. 30, 2012; Part 2 of 17; 200 pages.

Image File Wrapper downloaded on Aug. 6, 2014 for U,S. Appl. No. 13/883,887, filed Oct. 30. 2012; Part 2A of 17; 75 pages.

Image File Wrapper downloaded on Aug. 8, 2014 for U.S. Appl. No. 13/883,887, filed Oct. 30, 2012; Part 3 of 17; 276 pages.

Image File Wrapper downloaded on Aug. 6, 2014 for U.S. Appl. No. 13/863,867, filed Oct. 30, 2012; Part 4 of 17; 275 pages.

Image File Wrapper downloaded on Aug. 8, 2014 for U.S. Appl. No. 13/683,887, filed Oct. 30, 2012; Part 5 of 17; 275 pages.

Image File Wrapper downloaded on Aug. 6, 2014 for U.S. Appl. No. 13/863,887, filed Oct. 30, 2012; Part 6 of 17; 275 pages.

Image File Wrapper downloaded on Aug. 6, 2014 for U.S. Appl. No. 13/653,887, filed Oct. 30, 2012; Part 7 of 17; 100 pages.

(56) References Cited

OTHER PUBLICATIONS

Image File Wrapper downloaded on Aug. 6, 2014 for U.S. Appl. No. 13/663,887, filed Oct. 30, 2012; Part 7A of 17; 100 pages.
Image File Wrapper downloaded on Aug. 6, 2014 for U.S. Appl. No. 13/663,887, filed Oct. 30, 2012; Part 7B of 17; 75 pages.
Image File Wrapper downloaded on Aug. 6, 2014 for U.S. Appl. No. 13/683,887, filed Oct. 30, 2012; Part 8 of 17; 275 pages.
Image File Wrapper downloaded on Aug. 8, 2014 for U.S. Appl. No. 13/863,887, filed Oct. 30, 2012; Part 9 of 17; 275 pages.
Image File Wrapper downloaded on Aug. 6, 2014 for U.S. Appl. No. 13/663,887, filed Oct. 30, 2012; Part 10 of 17; 275 pages.
Image File Wrapper downloaded on Aug. 6, 2014 for U.S. Appl. No. 13/683,887, filed Oct. 30, 2012; Part 11 of 17; 275 pages.
Image File Wrapper downloaded on Aug. 6, 2014 for U.S. Appl. No. 13/683,887, filed Oct. 30, 2012; Part 12 of 17; 275 pages.
Image File Wrapper downloaded on Aug. 6, 2014 for U.S. Appl. No. 13/883,887, filed Oct. 30, 2012; Part 13 of 17; 275 pages.
Image File Wrapper downloaded on Aug. 6, 2014 for U.S. Appl. No. 13/863,887, filed Oct. 30, 2012; Part 14 of 17; 275 pages.
Image File Wrapper downloaded on Aug. 6, 2014 for U.S. Appl. No. 13/663,887, filed Oct. 30, 2012; Part 15 of 17; 275 pages.
Image File Wrapper downloaded on Aug. 6, 2014 for U.S. Appl. No. 13/863,887, filed Oct. 30, 2012; Part 16 of 17; 275 pages.
Image File Wrapper downloaded on Aug. 6, 2014 for U.S, Appl. No. 13/883,887, filed Oct. 30, 2012; Part 17 of 17; 275 pages.
Image File Wrapper downloaded on Aug. 6, 2014 for U.S. Appl. No. 13/683,887, filed Oct. 30, 2012; Part 17A of 17; 275 pages.
Image File Wrapper downloaded on Mar. 24, 2015 for U.S. Appl. No. 14/338,671, filed Jul. 23, 2014; Part 1 of 17; 300 pages.
Image File Wrapper downloaded on Mar. 24, 2016 for U.S. Appl. No. 14/336,871, filed Jul. 23, 2014; Part 2 of 17; 150 pages.
Image File Wrapper downloaded on Mar. 24, 2015 for U.S. Appl. No. 14/338,671, filed Jul. 23, 2014; Part 2A of 17; 150 pages.
Image File Wrapper downloaded on Mar. 24, 2015 for U.S. Appl. No. 14/338,671, filed Jul. 23, 2014; Part 3 of 17; 150 pages.
Image File Wrapper downloaded on Mar. 24, 2015 for U.S. Appl. No. 14/338,671, filed Jul. 23, 2014; Part 3A of 17; 150 pages.
Image File Wrapper downloaded on Mar. 24, 2015 for U.S. Appl. No. 14/338,071, filed Jul. 23, 2014; Part 4 of 17; 300 pages.
Image File Wrapper downloaded on Mar. 24, 2016 for U.S. Appl. No. 14/338,871, flied Jul. 23, 2014; Part 6 of 17; 300 pages.
Image File Wrapper downloaded on Mar. 24, 2015 for U.S. Appl. No. 14/338,671, filed Jul. 23, 2014; Part 6 of 17; 300 pages.
Image File Wrapper downloaded on Mar. 24, 2015 for U.S. Appl. No. 14/338,671, filed Jul. 23, 2014; Part 7 of 17; 100 pages.
Image File Wrapper downloaded on Mar. 24, 2015 for U.S. Appl. No. 14/338,671, filed Jul. 23, 2014; Part 7A of 17; 100 pages.
Image File Wrapper downloaded on Mar. 24, 2015 for U.S. Appl. No. 14/338,871, filed Jul. 23, 2014; Part 7B of 17; 100 pages.
Image File Wrapper downloaded on Mar. 24, 2018 for U.S. Appl, No. 14/338,871, filed Jul. 23, 2014; Part 8 of 17; 300 pages.
Image File Wrapper downloaded on Mar. 24, 2015 for U.S. Appl. No. 14/338,871, filed Jul. 23, 2014; Part 9 of 17; 300 pages.
Image File Wrapper downloaded on Mar. 24, 2016 for U.S. Appl. No. 14/338,671, filed Jul. 23, 2014; Part 10 of 17; 300 pages.
Image File Wrapper downloaded on Mar. 24, 2016 for U.S. Appl. No. 14/338,671, filed Jul. 23, 2014; Part 11 of 17; 300 pages.
Image File Wrapper downloaded on Mar. 24, 2015 for U.S. Appl. No. 14/338,671, filed Jul. 23, 2014; Part 12 of 17; 300 pages.
Image File Wrapper downloaded on Mar. 24, 2015 for U.S. Appl. No. 14/338,671, filed Jul. 23, 2014, Part 13 of 17; 300 pages.
Image File Wrapper downloaded on Mar. 24, 2015 for U.S. Appl. No. 14/338,671, filed Jul. 23, 2014; Part 13 of 17; 300 pages.
Image File Wrapper downloaded on Mar. 24, 2015 for U.S. Appl. No. 14/338,871, filed Jul. 23, 2014; Part 14 of 17; 300 pages.
Image File Wrapper downloaded on Mar. 24, 2015 for U.S. Appl, No. 14/335,671, filed Jul. 23, 2014; Part 18 of 17; 150 pages.
Image File Wrapper downloaded on Mar. 24, 2015 for U.S. Appl. No. 14/338,671, filed Jul. 23, 2014; Part 16A of 17; 160 pages.
Image File Wrapper downloaded on Mar. 24, 2015 for U.S. Appl. No. 14/338,671, filed Jul. 23, 2014; Part 17 of 17; 229 pages.
Office Action dated Oct. 29, 2014 for U.S. Appl. No. 13/633,878. filed Oct. 30, 2012.
Response filed Dec. 30, 2014 of Office Action dated Oct. 29, 2014 for U.S. Appl. No. 13/633,878, filed Oct. 30, 2012.
Office Action dated Jan. 28, 2015 for U.S. Appl. No. 13/955,952, filed Jul. 31, 2013.
Office Action dated Feb. 23, 2015; for U.S. Appl. No. 14/064,572, filed Oct. 23, 2013; 29 pages.
Notice of Allowance dated Jul. 14, 2014 for U.S. Appl. No. 13/833,050, filed Mar. 15, 2013.
Response filed Mar. 10, 2015 of Office Action dated Feb. 23, 2015 for U.S. Appl. No. 14/064,672, filed Oct. 28, 2013.

\* cited by examiner

RF AMPLIFIER HAVING DISCRETE SUPPLY VOLTAGES

CROSS REFERENCE TO RELATED APPLICATIONS

This application is a continuation of co-pending U.S. application Ser. No. 14/338,671, filed Jul. 23, 2014, which is a continuation of co-pending U.S. application Ser. No. 13/663,878, filed Oct. 30, 2012 and co-pending U.S. application Ser. No. 13/663,887, filed Oct. 30, 2012, now U.S. Pat. No. 8,824,978, all of which are hereby incorporated by reference herein in their entireties.

FIELD

Subject matter disclosed herein relates generally to radio frequency (RF) circuits and, more particularly, to devices, systems, and techniques for implementing RF amplifiers and transmitters that are capable of achieving high linearity and high efficiency simultaneously.

BACKGROUND

As is known in the art, a radio frequency (RF) transmitter is a device that produces RF signals. RF transmitters may be included, for example, as part of a radio communication system that uses electromagnetic waves (radio waves) to transport information over a distance.

As is also known, a trade-off must generally be made in RF communications transmitters between energy efficiency and linearity. Over the decades of development of the RF transmitter and corresponding RF amplifiers, it has generally been true that one could obtain either high efficiency or high linearity, but not both. It would, therefore, be desirable to provide systems and techniques that allow a user to amplify RF signals and/or transmit data carrying RF signals with both high efficiency and high linearity.

SUMMARY

Systems and techniques are described herein that allow radio frequency (RF) signals to be amplified and/or transmitted with both high efficiency and high linearity. Digital control may be maintained over both the amplitudes and the phases of RF input signals applied to one or more power amplifiers. Digital control may also be maintained over the supply voltages applied to the one or more power amplifiers. In some embodiments, non-linear power amplifiers may be used to achieve high power efficiency within the RF transmitter. Digital control techniques may be used to achieve linearity and to further enhance efficiency. In at least one implementation, the amplitudes of one or more RF input signals of the one or more power amplifiers may be controlled to achieve backoff in the power amplifier to generate a desired output power level.

In accordance with one aspect of the concepts, systems, circuits, and techniques described herein, an RF power amplifier system comprises: A radio frequency (RF) power amplifier system, comprising: a digital-to-RF modulator to generate an RF input signal for the RF power amplifier based on input information indicative of amplitude values and phase values; a voltage control unit to provide a variable supply voltage to the RF power amplifier in response to one or more control signals, the variable supply voltage being selected from a plurality of discrete voltage levels; and a controller to provide the input information to the digital-to-RF modulator and the one or more control signals to the voltage control unit based, at least in part, on data to be output by the RF power amplifier system; wherein the voltage control unit includes: an output terminal to provide an output voltage signal, the output terminal being coupled to a supply input of the RF power amplifier; first, second, and third voltage terminals to carry first, second, and third discrete voltage levels in the plurality of discrete voltage levels, respectively; a first switch coupled between the output terminal and the first voltage terminal; a second switch coupled between the output terminal and a first intermediate node; a third switch coupled between the first intermediate node and the second voltage terminal; and a network comprising at least one switch coupled between the first intermediate node and the third voltage terminal; wherein the controller is configured to control states of at least the second switch and the at least one switch.

In one embodiment, the network includes a fourth switch coupled between the first intermediate node and a second intermediate node and a fifth switch coupled between the second intermediate node and the third voltage terminal; and the voltage control unit further comprises: a fourth voltage terminal to carry a fourth discrete voltage level in the plurality of discrete voltage levels; and a sixth switch coupled between the second intermediate node and the fourth voltage terminal; wherein the controller is configured to control states of at least the second, fourth, and sixth switches.

In one embodiment, the voltage control unit further comprises a seventh switch coupled between the output terminal and a ground terminal, wherein the controller is configured to control states of at least the second, seventh and at least one switches.

In one embodiment, the first and third switches each include a diode.

In one embodiment, the plurality of discrete voltage levels consists of three voltage levels.

In one embodiment, the plurality of discrete voltage levels consists of four voltage levels.

In one embodiment, the controller is configured to make decisions about voltage level changes for the RF power amplifier based, at least in part, on a window of data samples representing data to be output by the RF power amplifier system.

In one embodiment, the voltage control unit further comprises a low pass transition shaping filter to filter the output voltage signal before it is provided to the RF power amplifier.

In one embodiment, one or more of the first switch, the second switch, the third switch, and the at least one switch are provided as complimentary metal oxide semiconductor (CMOS) technology.

In one embodiment, the voltage control unit further comprises a switched capacitor converter to synthesize multiple ratiometric voltages from a single input voltage, the switched capacitor converter providing at feast some of the discrete voltage levels of the plurality of discrete voltage levels.

In one embodiment, the RF power amplifier system includes multiple RF power amplifiers and a combiner to combine the output signals of the multiple RF power amplifiers.

In one embodiment, the controller is configured to control states of the first switch, the second switch, the third switch, and the at least one switch.

In accordance with another aspect of the concepts, systems, circuits, and techniques described herein, a machine implemented method for operating an RF transmitter having a digital-to-RF modulator driving an RF power amplifier comprises: obtaining transmit data to be transmitted from the RF transmitter; providing input information for the digital-to-RF modulator based, at least in part, on the transmit data, the input information to control an amplitude and a phase of an RF output signal of the digital-to-RF modulator; selecting a supply voltage for the RF power amplifier based, at least in part, on the transmit data, the supply voltage being selected from a plurality of discrete voltage levels, wherein the supply voltage changes with time; and providing control signals to a plurality of switches within a voltage control unit based on the changing supply voltage selection, wherein the voltage control unit includes: an output terminal to provide an output voltage signal, the output terminal being coupled to a supply terminal of the RF power amplifier; first, second, and third voltage terminals to carry first, second, and third discrete voltage levels in the plurality of discrete voltage levels, respectively; a first switch coupled between the output terminal and the first voltage terminal; a second switch coupled between the output terminal and a first intermediate node; a third switch coupled between the first intermediate node and the second voltage terminal; and a network comprising at least one switch coupled between the first intermediate node and the third voltage terminal, wherein providing control signals includes providing control signals to at least the second switch and the at least one switch.

In one embodiment, the network includes a fourth switch coupled between the first intermediate node and a second intermediate node and a fifth switch coupled between the second intermediate node and the third voltage terminal; and the voltage control unit further comprises: a fourth voltage terminal to carry a fourth discrete voltage level in the plurality of discrete voltage levels; and a sixth switch coupled between the second intermediate node and the fourth voltage terminal; wherein providing control signals includes providing control signals to the second, fourth, and sixth switches.

In one embodiment, the voltage control unit further comprises a seventh switch coupled between the output terminal and a ground terminal, wherein providing control signals includes providing control signals to the first, second, third, fourth, fifth, sixth, and seventh switches.

In one embodiment, the first and third switches each include a diode.

In one embodiment, the plurality of discrete voltage levels consists of three voltage levels.

In one embodiment, the plurality of discrete voltage levels consists of four voltage levels.

In one embodiment, selecting a supply voltage includes selecting the supply voltage based, at least in part, on a window of data samples associated with the transmit data.

In one embodiment, the method further comprises processing the supply voltage signal in a low pass filter before applying the signal to the RF power amplifier.

In one embodiment, the RF transmitter includes multiple digital-to-RF modulators driving multiple RF power amplifiers and a combiner to combine output signals of the multiple power amplifiers.

In one embodiment, providing control signals includes providing control signals to the first switch, the second switch, the third switch, and the at least one switch.

BRIEF DESCRIPTION OF THE DRAWINGS

The foregoing features may be more fully understood from the following description of the drawings in which.

DETAILED DESCRIPTION

Figure 1:
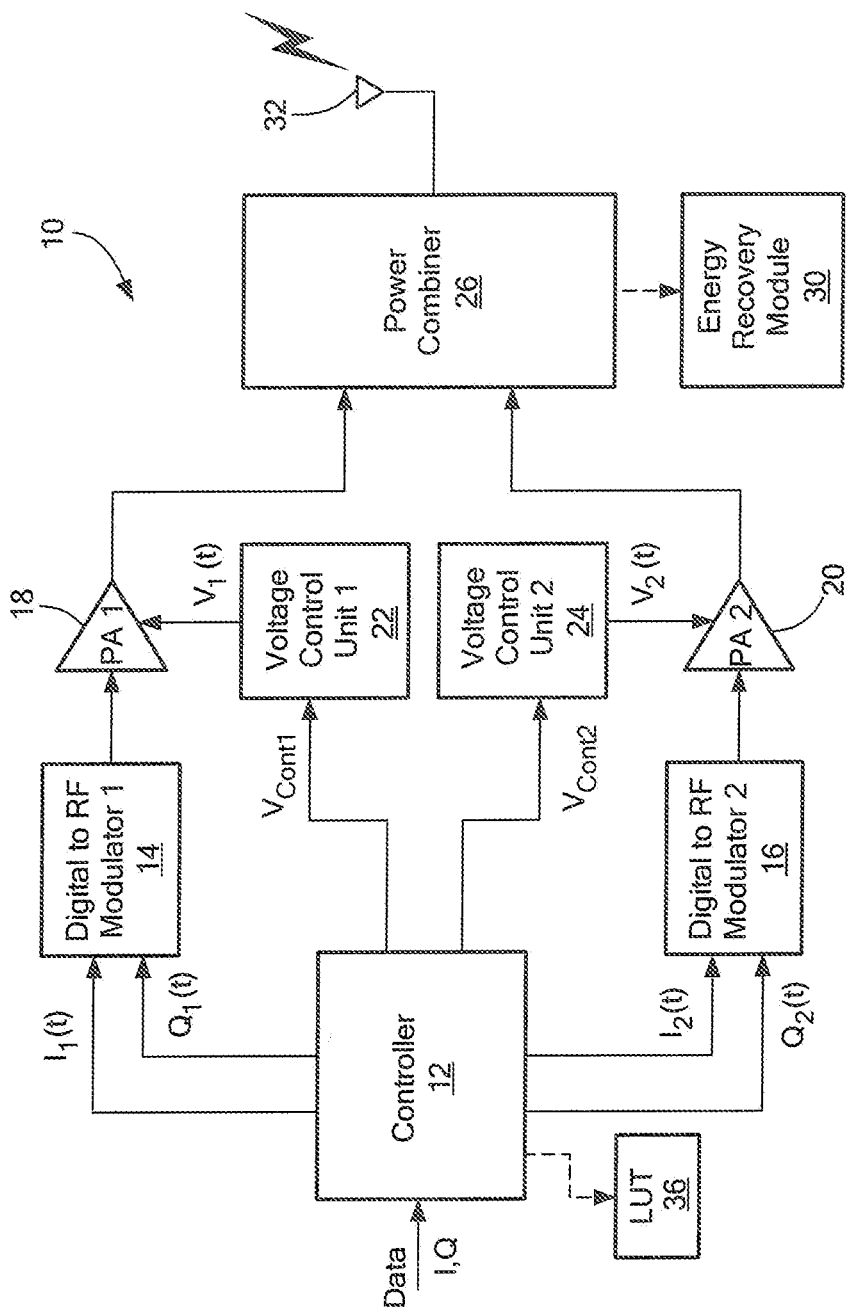
FIG. 1 is a block diagram illustrating an exemplary radio frequency (RF) transmitter in accordance with an embodiment.

FIG. 1 is a block diagram illustrating an exemplary radio frequency (RF) transmitter 10 in accordance with an embodiment. As will be described in greater detail, RF transmitter 10 is capable of simultaneously achieving both high efficiency and high linearity. As illustrated, RF transmitter 10 may include: a controller 12; first and second digital to RF modulators 14, 16; first and second power amplifiers 18, 20; first and second voltage control units 22, 24; a power combiner 26; and an energy recovery module 30. RF transmitter 10 may be coupled to one or more antennas 32 and/or other transducers to facilitate the transmission of RF signals to one or more remote wireless entities. In some implementations, first and second power amplifiers 18, 20 may use substantially the same amplifier design. In other implementations, different amplifier designs and/or architectures may be used. In some embodiments, first and second power amplifiers 18, 20 may be non-linear amplifiers (and, in some cases, highly non-linear amplifiers). As is well known, non-linear amplifiers generally operate more efficiently than linear amplifiers.

First and second digital to RF modulators 14, 16 are operative for generating RF input signals for first and second power amplifiers 18, 20, respectively, based on information received from controller 12. First and second voltage control units 22, 24 are operative for providing variable supply voltages to first and second power amplifiers 18, 20, respectively, based on control signals received from controller 12. In a typical implementation, controller 12 will receive or otherwise obtain a stream of data to be transmitted from RF transmitter 10 (i.e., transmit data). Controller 12 may then use this transmit data, among other things, to provide signals for first and second digital to RF modulators 14, 16 and first and second voltage control units 22, 24 that will result in the transmission of the transmit data from antenna(s) 32. Controller 12 may update the information delivered to first and second digital to RF modulators 14, 16 and the control signals delivered to first and second voltage control units 22, 24 on a sample-by-sample basis in some implementations.

In at least one implementation, controller 12 can provide independent control to each of first and second voltage control units 22, 24 so that different supply voltages can be simultaneously applied to first and second power amplifiers 18, 20. Likewise, in some implementations, controller 12 can provide different input information to first and second digital to RF modulators 14, 16 so that different RF input signals are simultaneously applied to first and second power amplifiers 18, 20. Power combiner 26 is operative for combining the output signals of first and second power amplifiers 18, 20 to generate an RF transmit signal at an output thereof. The RF transmit signal may then be delivered to antenna(s) 32 for transmission into a wireless channel. As will be appreciated, the RF transmit signal should include an accurate representation of the original transmit data.

First and second power amplifiers 18, 20 may each include any type of power amplifier capable of amplifying an RF signal. In some implementations, first and second power amplifiers 18, 20 may be non-linear amplifiers to improve the efficiency of operation of the RF transmitter. In some embodiments, highly non-linear amplifiers may be used. First and second power amplifiers 18, 20 may use the same amplifier design or different amplifier designs. Likewise, first and second power amplifiers 18, 20 may use the same amplifier architecture or different amplifier architectures. First and second voltage control units 22, 24 may each include any type of circuit, component, or system that is capable of controllably varying a supply voltage level applied to a power amplifier in an RF transmitter. These units may include, for example, variable power supplies, discrete power supplies, batteries, multi-level power converters, and/or switching circuits that are capable of switching between preset voltage potentials.

First and second digital to RF modulators 14, 16 may include any type of circuits or components that are capable of converting digital input information representative of a time varying amplitude and a time-varying phase into an analog RF output signal having corresponding amplitude and phase characteristics. Power combiner 26 may include any type of device or structure that is capable of combining multiple RF signals. This may include, for example, a hybrid combiner, a transformer combiner, a Wilkinson combiner, and or others. Power combiner 26 may be an isolating combiner or a non-isolating combiner.

As described above, controller 12 may receive or otherwise acquire transmit data that needs to be transmitted into a wireless channel. The transmit data may be in any format (e.g., a binary bit stream; I and Q data; etc.). Controller 12 may then use this data, as well as other possible factors, to provide signals for first and second digital to RF modulators 14, 16 and first and second voltage control units 22, 24. In some implementations, the goal may be to generate an RF transmit signal that includes an accurate representation of the transmit data. Any of a number of different modulation and coding schemes (MCSs) may be used to represent the transmit data within the RF transmit signal. The MCS may include, for example, binary phase shift keying (BPSK), quadrature phase shift keying (QPSK), quadrature amplitude modulation (e.g., QAM, 16 QAM, 64 QAM, 128 QAM, etc), orthogonal frequency division multiplexing (OFDM), and/or others. Some of these MCSs have relatively high peak to average power ratios. As is well known, MCSs having high peak to average power ratios typically require highly linear power amplification to provide an accurate representation of transmit data. In various embodiments described herein, transmission systems and techniques are described that are capable of providing efficient power amplification with sufficient linearity to support MCSs having high peak to average power ratios.

As shown in FIG. 1, after controller 12 acquires transmit data, it may use the data to provide input information to first and second digital to RF modulators 14, 16. In one possible approach, controller 12 may provide separate I and Q data to each of the first and second digital to RF modulators 14, 16. That is, controller 12 may generate $Q_1$ for first digital to RF modulator 14 and $I_2, Q_2$ for second digital to RF modulator 16. First and second digital to RF modulators 14, 16 may then use the I, Q information to modulate an RF carrier wave to generate a corresponding RF signal at an output thereof. As is well known, I and Q data is generally representative of an amplitude and a phase. Thus, $I_1$ and $Q_1$ may, for example, have a corresponding amplitude $A_1$ and phase $\theta_1$. The RF signal output by first digital to RF modulator 14 in response to $I_1$ and $Q_1$ may therefore be an RF signal having amplitude $A_1$ and phase $\theta_1$. In some implementations, the input information provided to first and second digital to RF modulators 14, 16 may be in a format other than I and Q. For example, in one possible approach, amplitude (A1, A2) and phase ($\theta_1$, $\theta_2$) information may be delivered to first and second digital to RF modulators 14, 16 by controller 12. As described above, the input information applied to first and second digital to RF modulators 14, 16 may change on a sample by sample basis in some embodiments.

In some implementations, first and second voltage control units 22, 24 may each be capable of providing one of a plurality of predetermined voltages to corresponding power amplifiers 18, 20 in response to control signals from controller 12. Thus, a control signal $V_{CONT1}$ may select a voltage value for power amplifier 18 and a control signal $V_{CONT2}$ may select a voltage value for power amplifier 20. As with the input information applied to first and second digital to RF modulators 14, 16, the supply voltage values applied to first and second power amplifiers 18, 20 may change on a sample by sample basis in some embodiments.

In addition to the above, in some embodiments, controller 12 may use the amplitude information delivered to first and second digital to RF modulators 14, 16 (e.g., the amplitude value associated with $I_1$ and $Q_1$, etc.) to control/adjust a power level output by the RF transmitter 10 (e.g., a transmit power level). For example, controller 12 may use a reduced amplitude value for one or both of the digital to RF modulators 14, 16 when a lower transmit power level is desired.

In some embodiments, controller 12 may determine input information for first and second digital to RF modulators 14, 16 and control information for first and second voltage control units 22, 24 in real time based on the transmit data. In some other embodiments, an optional lookup table (LUT) 36 may be used to provide the required information. Controller 12 may retrieve values from LUT 36 for the first and second digital to RF modulators 14, 16 and the first and second voltage control units 22, 24 that are designed to accurately represent the transmit data in the transmit signal.

In some embodiments, power combiner 26 may be an isolating combiner having an isolation port. As is well know, an isolating combiner will sometimes output energy at the isolation port due to, for example, mismatches, imbalances, and/or reflections in the circuitry coupled to the combiner. Typically, a resistive termination will be coupled to the isolation port of an isolating combiner to provide an impedance match for the port and to dissipate any energy output from the port. In some embodiments, an energy recovery module 30 may be coupled to the isolation port of an isolating combiner, rather than a conventional resistive termination, for use in recovering some or all of the energy that would otherwise have been dissipated. Energy recovery module 30 may include circuitry for converting the recovered energy into a useful form. For example, the recovered energy may be converted to a form that can be used to charge a battery. Alternatively, the recovered energy may be converted to a form that may be used to energize other circuitry within RF transmitter 10.

Figure 2:
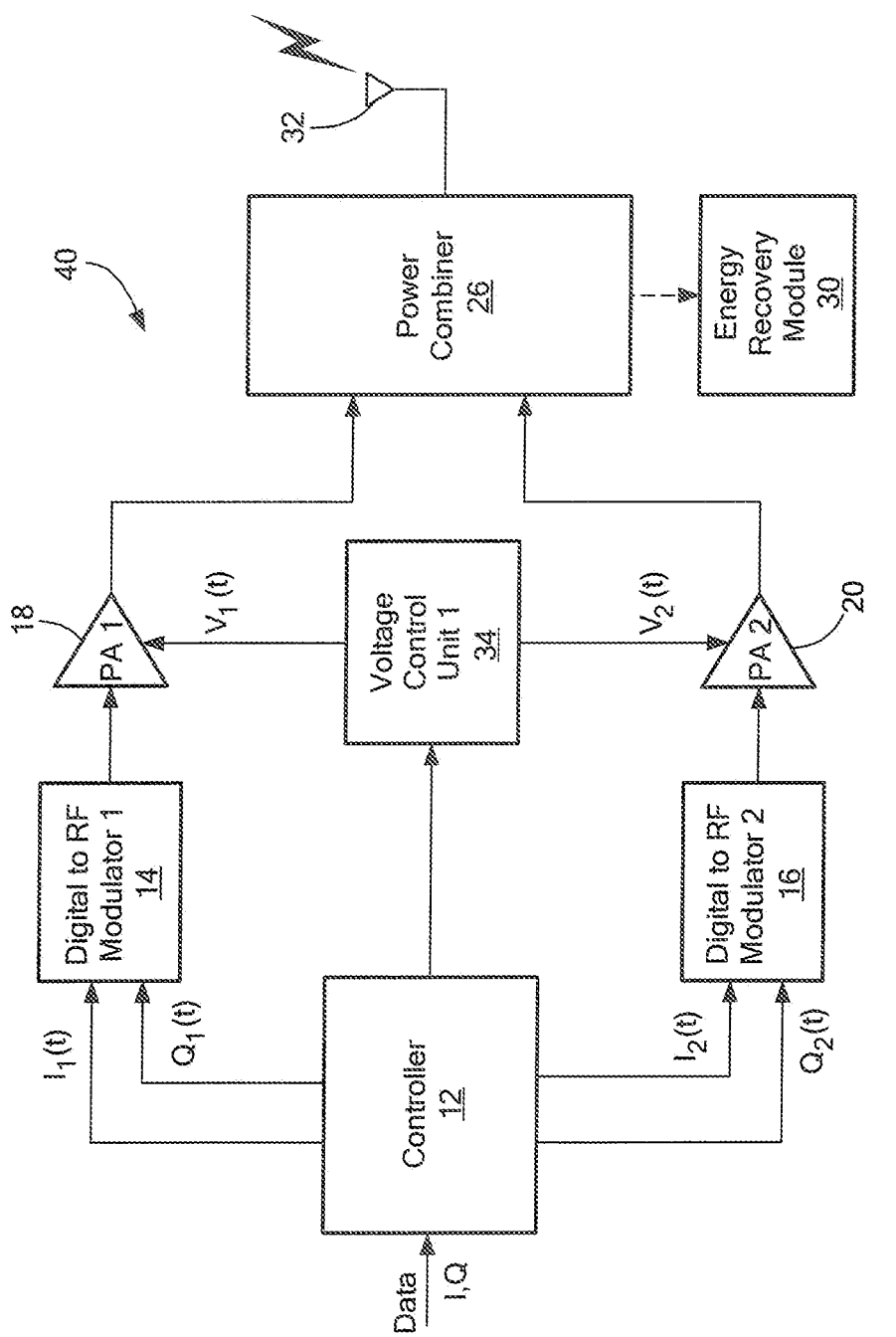
FIG. 2 is a block diagram illustrating an exemplary RF transmitter in accordance with another embodiment.

In the embodiment illustrated in FIG. 1, separate voltage control units 22, 24 are provided for first and second power amplifiers 18, 20. In some implementations, the functions of multiple voltage control units may be implemented using a single voltage control structure. FIG. 2 is a block diagram illustrating an exemplary radio frequency (RF) transmitter 40 in accordance with an embodiment. As shown in FIG. 2, a single voltage control unit 34 may be used to provide variable voltages for both of power amplifiers 18, 20.

In some embodiments, power amplification systems are provided that incorporate dynamic selection from among a discrete set of voltage levels for providing drain bias voltages to a set of power amplifiers (PAs). Selection from among multiple discrete voltage levels in setting one or more drain bias voltages is common to a number of system architectures. This includes systems that select from among a discrete set of input voltages and then provide additional regulation to provide a continuously-varying drain voltage (see, e.g., "Multilevel Power Supply for High Efficiency RF Amplifiers," by Vasic et al., 2009 *IEEE Applied Power Electronics Conference*, pp. 1233-1238, February 2009; and U.S. Pat. No. 7,482, 869 to Wilson, entitled "High Efficiency Amplification.") and systems that directly exploit discrete drain levels, including "class G" amplifiers (see, e.g., "Average Efficiency of Class-G Power Amplifiers," by F. H. Raab, *IEEE Transactions on Consumer Electronics*, Vol. CE-32, no. 2, pp. 145-150, May 1986; and "A Class-G Supply Modulator and Class-E PA in 130 nm CMOS," by Walling et al., *IEEE Journal of Solid-State Circuits*, Vol. 44, No. 9, pp. 2339-2347, September 2009), multi-level LINC (MLINC) Power Amplifiers (see, e.g., U.S. Patent Application Publication 2008/0019459 to Chen et al. entitled "Multilevel LINC Transmitter;" and U.S. Patent Application Publication US 2010/0073084 to Hur et al. entitled "Systems and Methods for a Level-Shifting High-Efficiency LINC Amplifier using Dynamic Power Supply" and Asymmetric Multilevel Outphasing (AMO) Power Amplifiers (see, e.g., U.S. Pat. Nos. 8,026,763 and 8,164,384 to Dawson et al. entitled "Asymmetric Multilevel Outphasing Architecture for RF Amplifiers" and "A 2.4-GHz, 27-dBm Asymmetric Multilevel Outphasing Power Amplifier in 65-nm CMOS" by Godoy at al., *IEEE Journal of Solid-State Circuits*, 2012). In the present application, dynamic selection from among a discrete set of voltage levels (or "level selection") is primarily discussed in the context of a single or multi-amplifier, multi-level power amplifier architecture (such as, for example, the power amplifier architecture used in RF transmitter 10 of FIG. 1). However, the level selection techniques discussed herein can also be used to improve performance in other architectures utilizing discrete voltage levels, including those enumerated above.

Level selection can be performed based upon the instantaneous output envelope value or, when processing digital data from which to synthesize the RF output, upon an individual digital sample to be synthesized. In one possible approach, the lowest discrete voltage level or levels may be used that are compatible with synthesizing the required instantaneous RF output in order to provide the highest instantaneous "drain" efficiency. In at least one embodiment, discrete voltage levels may be selected based upon a "window" of data to be transmitted, rather than a single sample or "instantaneous" value. In this manner, the number of level transitions that are used to synthesize a particular data stream can be reduced. In many cases, this technique may result in higher voltage levels being used than are absolutely necessary to synthesize a particular sample (thus reducing power amplifier "drain" efficiency). However, overall efficiency can be improved (or at least its degradation reduced) by mitigating the energy cost of transitioning among levels. Moreover, linearity (e.g., as measured by adjacent channel leakage ratio (ACLR) or adjacent channel power ratio (ACPR)), error vector magnitude (EVM), and other waveform quality metrics can be improved by reducing the number of level transitions required. This is because the system disturbance caused by transitioning levels on one or more PAs will typically have a cost in tears of the output trajectory, even though this can be compensated for using digital pre-distortion or other techniques.

Figure 10:
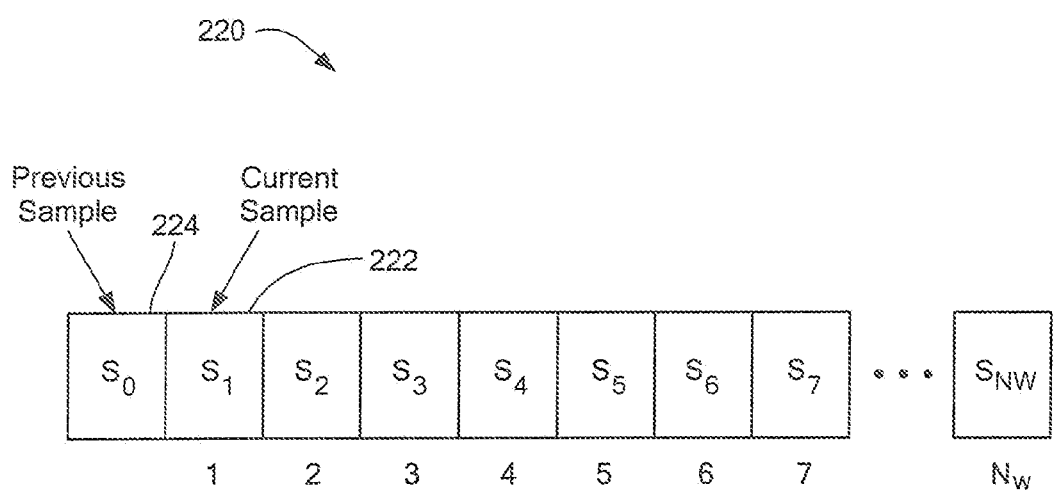
FIG. 10 is a diagram illustrating an exemplary sample window that may be used to make a voltage level change decision in a power amplification system in accordance with an embodiment.

In some embodiments, decisions may be made about the discrete voltage levels to apply based on one or more extended time periods, rather than relying solely on instantaneous conditions. In one approach, for example, a decision as to whether or not to change selected level(s) looks across a window of samples $N_W$ long (e.g., from a current sample under consideration into the future, from a previous sample in the past through the current sample and for one or more samples into the future, etc.). FIG. 10 is a diagram illustrating such a sample window 220. These samples may be represented as I,Q data values, as amplitudes/phases of the desired outputs, as vector values to be synthesized, etc., or may simply represent the output power or voltage amplitudes desired. For the current sample 222, the system may only transition to a lower level or set of levels (i.e., providing a lower maximum power) if that lower level or set of levels can provide sufficient output power over the whole window 220 of $N_W$ samples. If more power delivery is needed for the current sample 222 than can be provided by the level/set of levels used in the previous sample 224, then a transition is made to a level/set of levels capable of providing sufficient power. Otherwise, the level/set of levels remains unchanged from the previous sample 224 to the current sample 222.

Using the above-described technique reduces the number of transitions by ensuring that a "downward" level transition only occurs if an "upward" transition won't be necessary again in the near future. At the same time, an "upward" transition may always be used if needed to support the required output power during a given sample. It will be appreciated that many variations are possible which provide further reduction in number of transitions. For example, in one alternative approach, a decision may be made to make either an "upward" or a "downward" transition as long as it is certain that another transition will not be needed for at least a minimum number of samples (i.e., within a window of samples). In another alternative approach, if an "upward" transition is needed to support an output for less than a certain number of samples, that transition could be eliminated, and the power amplifiers driven to provide an output as close as possible to the desired output (during either the sample in question or averaged in some manner over multiple samples). This may reduce transitions, at the expense of some waveform quality degradation. If any of the above-described techniques are used, the Input drives for the individual power amplifiers may be adjusted accordingly for the selected drain voltage levels in order to provide the desired total output. In some embodiments, a controller may be programmed or configured to be capable of selecting a voltage value for a power amplifier that is lower than required to generate a desired instantaneous output power level if the need for a higher voltage level is short in duration compared to the time duration of the window of data samples. In other embodiments, a controller may be programmed or configured to be capable of selecting a voltage value for a power amplifier that is higher than a minimum voltage sufficient to generate a desired instantaneous output power level if the duration of time for which a lower voltage level is sufficient is short compared to the time duration of the window of data samples.

In some implementations, the above-described technique may be combined with other techniques including, for example, peak-to-average power ratio (PAPR) reduction techniques, techniques using hysteresis in the thresholds used to make level selection determinations, techniques that filter the data before and/or after the level-selection process, and/or others. In some implementations, the window lengths that are used with the above-described techniques may be dynamically and/or adaptively selected based on a performance criterion. In one approach, for example, the window lengths may be selected to maximize a combination of efficiency and output quality metrics.

Figure 12:
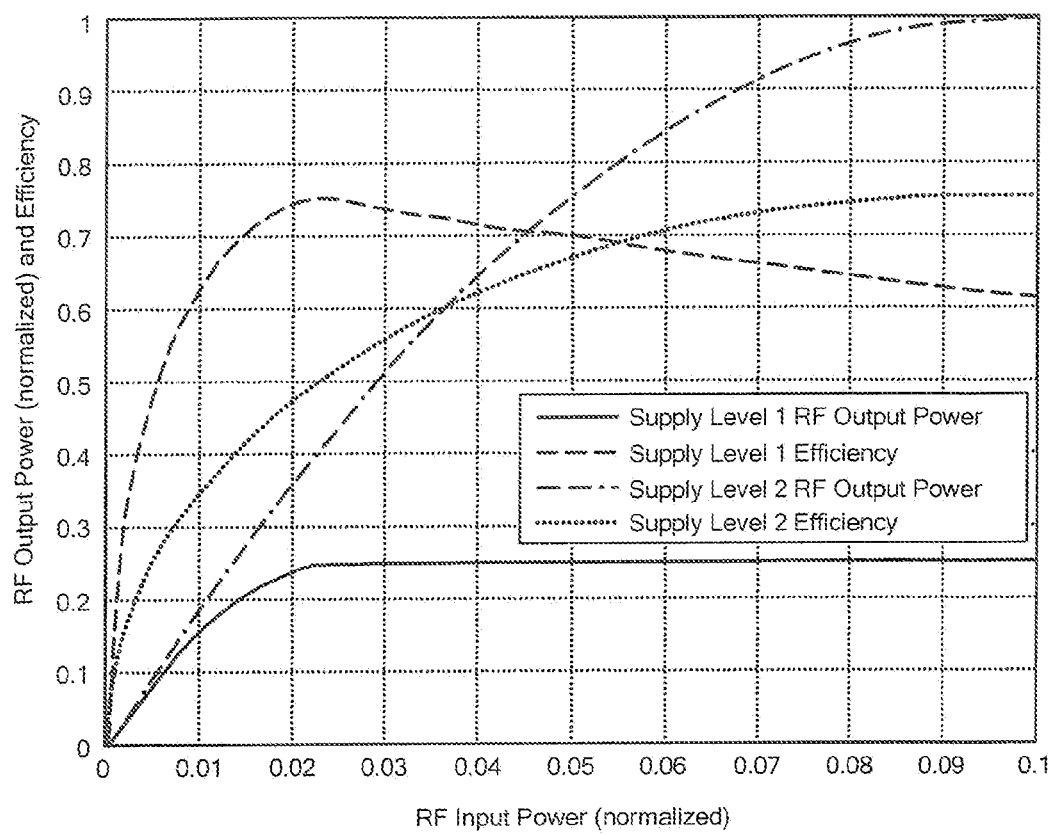
FIG. 12 is a plot illustrating the efficiency and output power of a power amplification system having a single power amplifier as a function of normalized RF drive power at two different dc power supply levels.

To provide a better understanding of the operation and benefits of the amplifier architectures described herein, the performance of a single power amplifier (PA) having two different dc supply voltages will now be described. This power amplifier could represent any number of PA classes (e.g., A,AB,B,F, inverse F, etc.) and could also represent a composite amplifier comprising an aggregation of output from multiple smaller PAs operated together (e.g., a Doherty amplifier, outphasing amplifier, etc.) FIG. 12 is a plot showing the efficiency and (normalized) output power of a power amplifier as a function of normalized RF drive power at two different do power supply levels (i.e., a lower dc supply, level 1, and a higher dc supply, level 2). It can be seen that for the level 2 dc supply, at a certain RF input power (0.1 normalized) the output power reaches a maximum saturated output power (1 normalized). The output power can be reduced to any value below this saturated maximum (i.e., "backing off" the output power) by reducing the RF input power. For low levels of RF input and output power, there is a nearly linear (proportional) relation between RF input power and RF output power. However, efficiency in this region is relatively low (e.g., below 40% for RF output powers below 0.25 normalized). The highest efficiency is found in regions of output power at or somewhat below the level at which output power saturates (e.g., efficiency above 70% for output power above 0.83 normalized). Increasing RF input power beyond the level that saturates the power amplifier, however, actually reduces efficiency. This occurs because total input power—dc plus RF—increases but output power does not increase (and in some cases can decrease with further increase in RF input power).

The power and efficiency for the lower voltage dc supply (level 1) is now considered. In this case, the maximum saturated output power is much lower than for the higher-voltage (level 2) dc supply (e.g., reaching a maximum output power of only 0.25 normalized). The output power can again be adjusted between zero and this lower maximum value by adjusting RF input power (e.g., backing off the output power by reducing the normalized input power to values below that which saturates the power amplifier), but higher output powers (above 0.25 normalized) are not obtainable at this supply level. It should be noted that for values of output power that can be reached at this lower supply level, higher efficiency is achieved using the lower dc supply level 1 than for the higher dc supply level 2, because the power amplifier is operated closer to its saturated value. Thus, for low values of output power, it is generally desirable to use a lower supply voltage value, so long as the desired output power is achievable and the desired level of linearity and controllability of the power amplifier is achievable.

The variation in efficiency with a given do voltage supply level is a motivation for power amplifier systems such as "Class G," that switch the power amplifier dc supply among different levels depending on the desired RF output power level. Selecting from multiple dc supply values such that the power amplifier operates at as high an efficiency as possible while being able to provide the desired RF output power can yield significant improvements in efficiency over that achieved with a single supply level.

Figure 13:
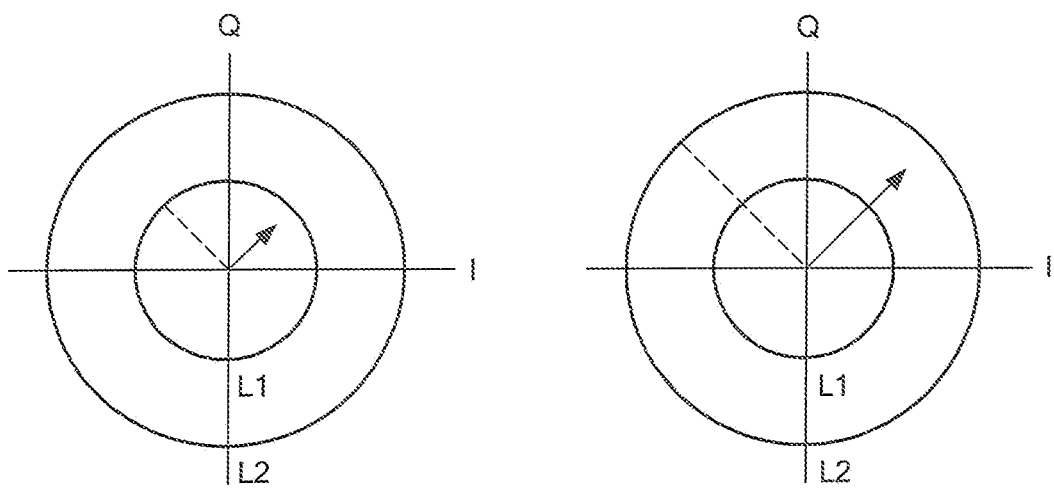
FIG. 13 is a pair of IQ plots illustrating achievable RF output amplitudes for a power amplification system having a single power amplifier using two different supply levels.

FIG. 13 includes two IQ plots illustrating the achievable RF outputs in terms of the output RF amplitude (i.e., phasor length, or RF voltage amplitude) for two different supply levels. For a given supply level, there is an RF output amplitude (proportional to the square root of RF output power) that may be specified as a maximum for that supply level. This maximum amplitude may be that corresponding to the absolute maximum saturated output power (under complete compression) for that supply level, as illustrated in FIG. 12, or may be a level somewhat below this. One may limit the maximum amplitude and power to somewhat slightly lower than those for complete saturation to simplify predistortion of drive signals (for linearization), to account for part-to-part variations in absolute maximum power, to place the specified maximum level in a desirable location on the efficiency vs. output characteristic, or for other reasons. As illustrated in FIG. 13, with the higher supply level, any RF output voltage vector having an amplitude less than or equal to the radius of the circle labeled L2 can be synthesized. With the lower supply level, one can synthesize any RF output voltage vector having an amplitude less than or equal to the radius of the circle labeled L1.

Figure 14:
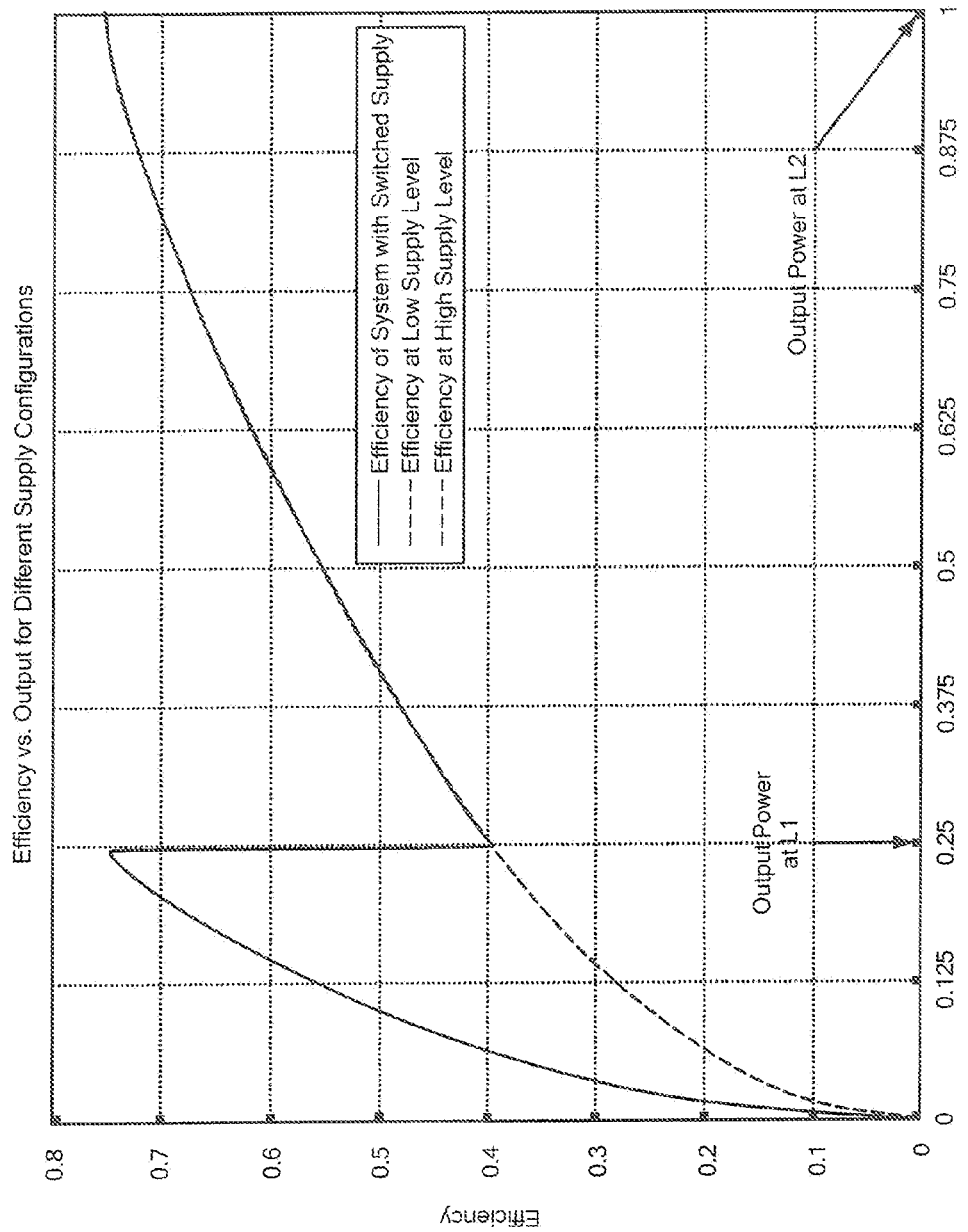
FIG. 14 is a plot of efficiency versus normalized output power for a power amplification system having a single power amplifier using two different supply levels in accordance with an embodiment.

To exploit the availability of multiple supply voltages to achieve increased efficiency, one may dynamically switch between the two supply levels. One way to do this is to switch supply levels based on the amplitude of the RF output vector being synthesized at any given time, such that the higher supply level is utilized whenever the desired output amplitude is between L1 and L2, and the lower supply level whenever the desired output amplitude is at or below L1. Using this approach, leads to the efficiency vs. normalized output power characteristic shown in FIG. 14.

In at least one embodiment, the signal to be synthesized is considered over a longer interval (e.g., a window including multiple future digital samples) and level switching is managed based on the moving window of data. For example, this may be done in a way that ensures that the desired instantaneous output amplitude can always be synthesized, but switch down to the lower supply level only if the desired output signal amplitude will remain at a level at or below L1 for a minimum duration. Amplitude or time hysteresis or other constraints can likewise be put into level switching decisions. For example, one may require that once a switching transition is made, no other transition will be made for a specified interval. Moreover, while this is illustrated for two power supply levels, the approach may be easily extended to an arbitrary number of supply levels. The length of the window used could be preselected, or could be dynamically selected based on one or more of a range of factors including output power levels (short or long term), channel characteristics, data bandwidth, signal statistics, transmit data, etc. Likewise, one could select the power supply levels based on the contents of a block of samples at a time, where the block length is fixed or dynamically selected.

An important consideration in the above discussion is that instantaneous efficiency is higher for operating points where the length of the synthesized vector is close to the maximum achievable amplitude radius. From this perspective, it is desirable to operate from the lowest supply for which the desired output can be synthesized. However, as there is an energy cost to switching between levels (e.g., owing to capacitor charging loss and switching loss of transistors setting the supply), it may be beneficial to overall system efficiency to use a higher-than-necessary supply level to synthesize an output over a short duration, if the energy cost of switching back and forth between levels is greater than that saved by using a lower supply level over that duration. Moreover, there is also a cost to linearity associated with switching among levels, in terms of noise injected to the output and loss of linearity owing to temporary disturbance of the power amplifier each time a level transition is made. Even if there is an overall efficiency penalty, one may choose to operate from a higher supply level than necessary to synthesize a particular output over a short duration if it reduces the number of supply transitions necessary, in order to improve linearity. One may also choose not to briefly step up a power supply level for a short duration, even if the desired instantaneous power does not get synthesized (possibly briefly dipping the peak of the signal), owing to the loss and noise injection penalty of switching between levels. The impact of level transitions on both efficiency and linearity may thus be considered as factors in selecting what level to use in a particular interval.

Further advantage may be attained in some embodiments by combining power from multiple power amplifiers (see, e.g., system 10 of FIG. 1). In one multiple power amplifier embodiment, there may be, for example, two power amplifiers that can each be supplied from two different (nonzero) supply voltages and an isolating power combiner to combine the output signals of the amplifiers in an isolating fashion. The voltage vector at the output port of the power combiner is a weighted sum of the output voltage vectors of the two individual power amplifiers. Likewise, a 2-way isolating combiner may produce an isolation voltage vector at the combiner isolation port that is a weighted difference of the two individual power amplifiers. The total energy delivered by the power amplifiers to the combiner is ideally delivered to either the output port (e.g., to be transmitted) or to the isolation port (e.g., where it may be dissipated in an isolation resistor, recovered via an energy recovery system, or transmitted via a second transmission path). For example, if the output phasor vectors of the individual PAs are $V_1$, $V_2$, the output port of the power combiner may produce a sum vector:

$$\Sigma = V_{out} = V_1 + V_2$$

and the isolation port of the combiner may produce a difference vector:

$$\Delta = V_{iso} = V_1 - V_2$$

As is known in the art, for an isolating combiner, the input impedances at the combiner inputs and the impedances of the loads at the output and isolation ports scale such that energy is conserved, as described above.

Because energy delivered to the isolation port is usually lost, it is usually desirable to synthesize the desired output voltage vector while minimizing the amplitude of the voltage vector at the isolation port. One may thus select the power supply levels, amplitudes and phases of the two power amplifiers to deliver the desired output while putting small (and preferably the minimum) power into the isolation port. Alternatively, if the signal to be provided at the isolation port is to be transmitted rather than dissipated, it may be desirable to control the supply voltages and PA input amplitudes such that the desired signals are synthesized at both the output and isolation ports while providing maximum overall efficiency of delivering energy to the two ports.

Figure 15:
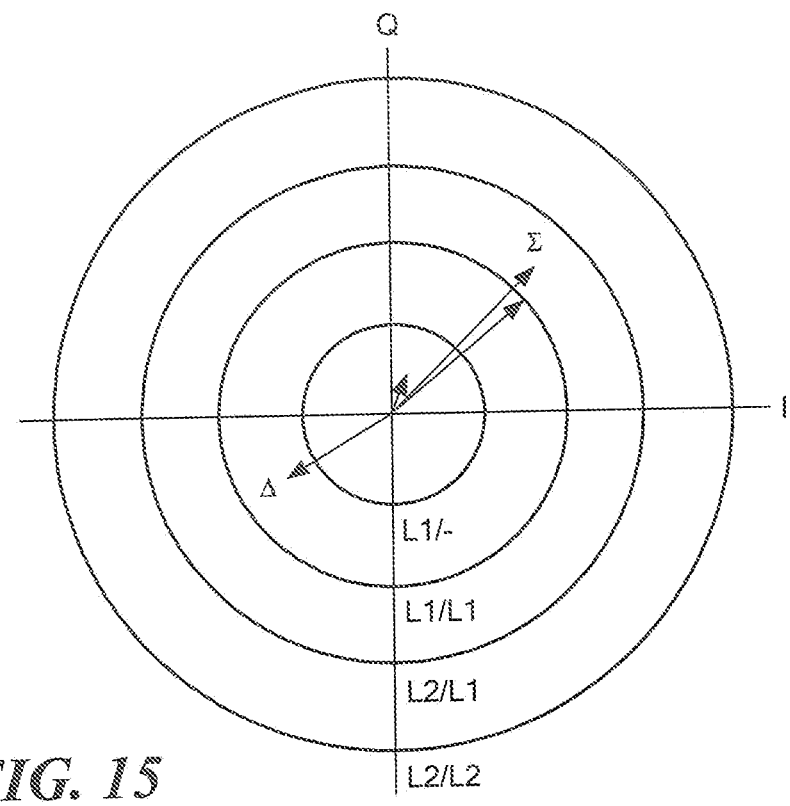
FIG. 15 is an IQ plot illustrating achievable output signal ranges for a power amplification system having two power amplifiers and a combiner, where each power amplifier is supplied from one of two supply levels.

FIG. 15 is an IQ plot illustrating achievable output signal ranges for a 2-amplifier system where each power amplifier is supplied from one of two supply levels. This is illustrated as regions on the IQ diagram in terms of the output RF amplitude (phasor length, or RF voltage amplitude). As illustrated, each power amplifier can generate an RF output with a maximum amplitude that depends on the power supply level selected for that amplifier. If both PAs are supplied using a higher voltage L2, an RF output vector anywhere inside the circle labeled L2/L2 can be synthesized, with this maximum achieved when the two individual PA vectors are in phase and at their specified maximum amplitudes for that supply level. If one PA is supplied at the higher voltage level and the other at the lower voltage level, an RF output vector anywhere inside the circle labeled L2/L1 can be synthesized, with this maximum achieved when the two individual PA vectors are in phase and each at their specified maximum amplitudes for their supply levels. At this maximum amplitude, nonzero output is delivered to the isolation port of the combiner, since there is a nonzero difference between the PA outputs. If both PAs are supplied at the lower voltage level, an RF output vector anywhere inside the circle labeled L1/L1 can be synthesized. Lastly, f only one PA, supplied at the lower voltage level drives the combiner (e.g., with the drive amplitude of the second PA set to zero and/or the power supply for the second PA set to zero), then a vector anywhere inside the circle labeled L1/– can be synthesized. Again, there is nonzero output delivered to the isolation port for this case if the combiner is isolating. An additional circle with only one PA supplied at the higher supply voltage level driving the combiner will also typically exist. However, operation within this circle will usually be less efficient than the other options. The above-described techniques may be extended for use within systems having more than two PAs, systems having more than two nonzero supply levels, systems using other types of power combiners, and/or a combination of the above.

Figure 16:
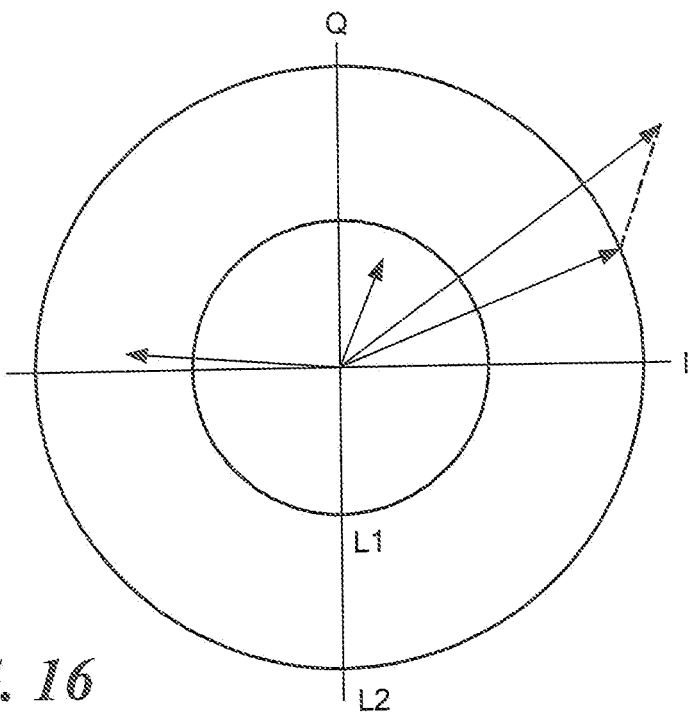
FIG. 16 is an IQ plot illustrating operation of an exemplary Asymmetric Multilevel Outphasing (AMO) based amplification system that includes two-power amplifiers and two power supply levels.

FIG. 16 is an IQ plot illustrating operation of an Asymmetric Multilevel Outphasing (AMO) based amplification system that includes two-power amplifiers and two power supply levels. Each of the power amplifiers may be operated at a specified maximum output amplitude (with respect to the power supply voltage used by each amplifier) such that the efficiency of each PA can be high. To modulate output power, the two PAs may be outphased (or phase shifted) such that the sum vector has the desired amplitude and phase. With an isolating combiner, there may be some dissipation associated with the difference vector sent to the isolation port. By changing the power supply levels depending upon the desired output amplitude, one can keep the amplitude of the difference vector small, maintaining high efficiency.

Figure 17:
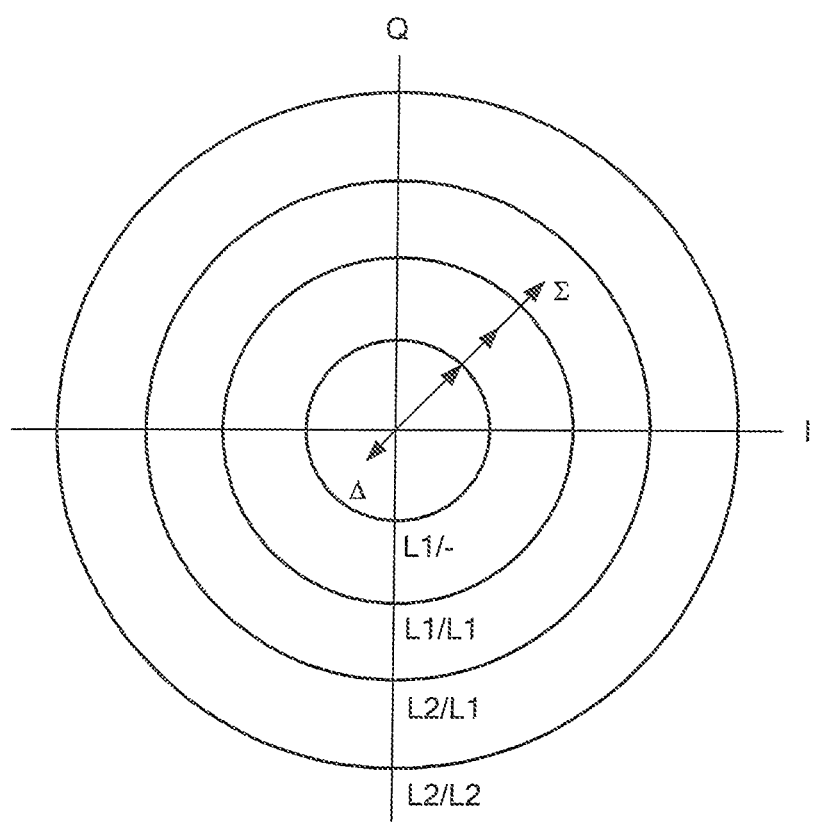
FIG. 17 is an IQ plot illustrating a control technique that may be used with a power amplification system having two power amplifiers and a combiner to operate the power amplifiers at or close to their achievable maximum amplitudes, while minimizing output at an isolation port of the combiner.
Figure 18:
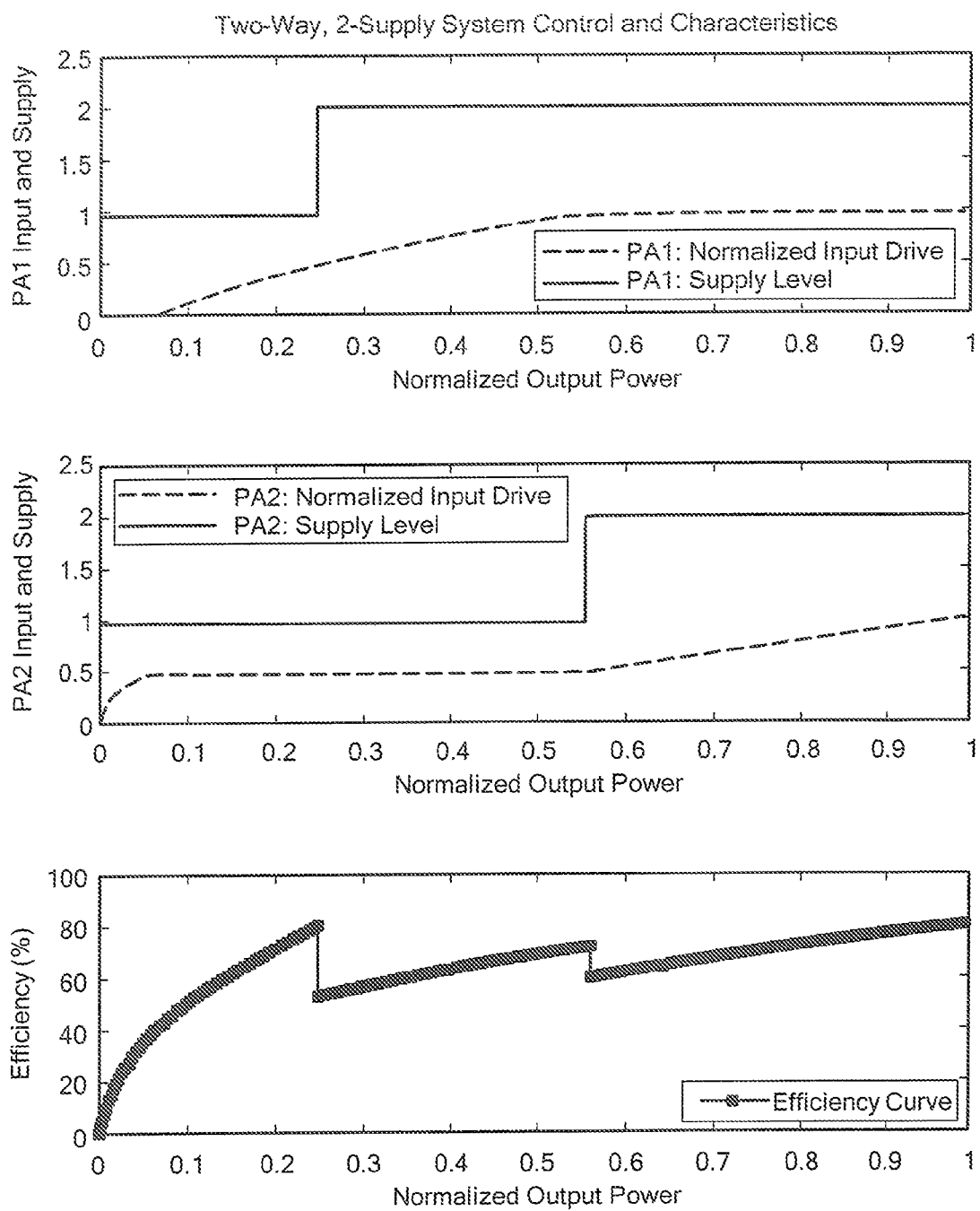
FIG. 18 is a series of plots illustrating how power amplifier drive levels and supply levels may be adjusted to control output power over an output power range in accordance with an embodiment.

In at least one embodiment, multiple power amplifiers may be controlled such that they synthesize individual output vectors that are in phase, but with amplitudes that may be different (and selecting among different supply levels) depending upon desired output. That is, for a given supply level selection for the two PAs, there is an achievable output amplitude maximum, which is reached by operating the two PAs at their achievable maximum. One can reduce the output below this by backing off one or both PAs below their achievable maximum. While backing off the PAs reduces PA efficiency, keeping the PAs in phase keeps the amplitude at an isolation port small, which can provide enhanced efficiency. More generally, depending on the combiner type, keeping the two PA outputs having a specified fixed phase relationship provides low isolation port loss and enhanced efficiency. In one approach, the lowest supply level set may be utilized that will enable the desired output to be achieved, and the drive of one or both PAs will then be backed off to reduce power for output amplitudes above that achievable with the next lower supply level set. This keeps the PAs operated at or close to their achievable maximum while minimizing the output at the isolation port. FIG. 17 is an IQ plot illustrating this approach. FIG. 18 is a series of plots illustrating how power amplifier drive levels and supply levels may be adjusted to control output power over an output power range in accordance with an embodiment. As shown, peaks in efficiency may be attained through judicious supply level selection as a function of power, and good efficiency may be maintained over a wide output power range.

In some embodiments, both backoff and outphasing techniques may be combined in a power amplification system to reduce output amplitude below an achievable maximum with a given set of supply voltages, as illustrated in FIG. 15. In this case, for each supply level set and output amplitude, a combination of backoff and outphasing can be selected to provide desirable tradeoffs between efficiency and linearity. Moreover, at very low power, one of the power amplifiers may be completely turned off and the other amplifier may be operated under backoff alone. It should also be appreciated that the combination of outphasing and backoff of the individual power amplifiers can be used to provide further control features. For example, instead of a difference vector being delivered to an isolation port to be dissipated, the "isolation port" can be connected to a second output for RF transmission (i.e., for a multi-output system). By controlling both backoff and outphasing of the two amplifiers, desired outputs can be provided at both the output port (first output) and the isolation port (second output) while preserving high efficiency.

In some embodiments, multiple different types of power amplifiers, or power amplifiers optimized for different characteristics, may be used within a power amplification system. The parameters of the system may then be controlled to best utilize the two types or characteristics of power amplifiers. For example, it may be desirable to optimize a first power amplifier for operation near its achievable maximum (e.g., a switched-mode or saturated power amplifier) and a second power amplifier for operation with good efficiency under a range of backoff (e.g., using a Doherty power amplifier or chireix outphasing power amplifier). In this case, one may control the system such that the first power amplifier usually operates at or near its achievable maximum, while the second regulates the output amplitude by backing off from its maximum. Different output power regions can further be covered by appropriately switching the supply levels of the power amplifier, with the second power amplifier operated at the higher of the supply levels if the supply levels are not the same. At the lowest output levels, the first power amplifier may be turned off, and the output controlled only with the second power amplifier.

Figure 3:
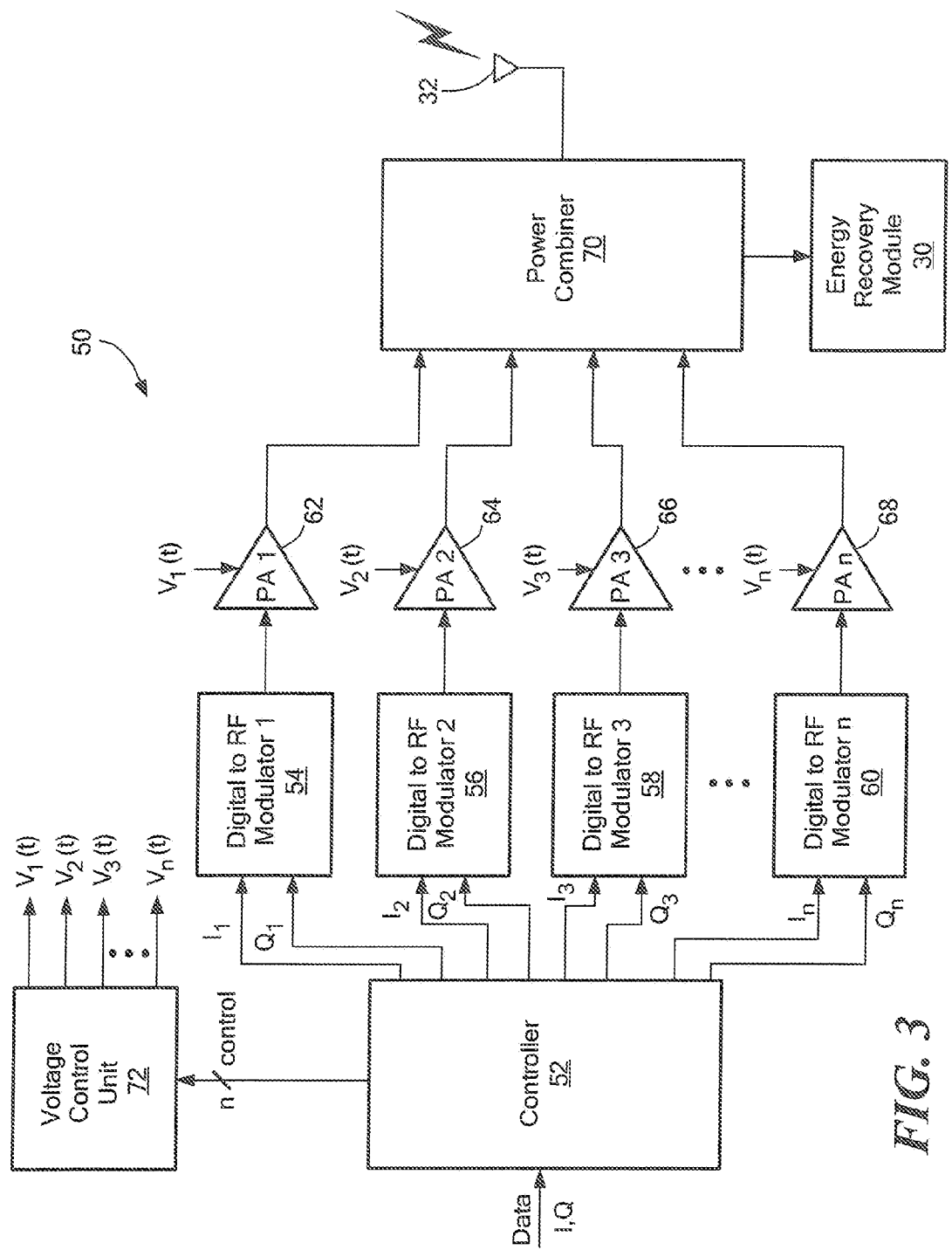
FIG. 3 is a block diagram illustrating an exemplary RF transmitter having at least four power amplifiers in accordance with an embodiment.

In some embodiments, as described above, more than two power amplifiers may be used to generate a transmit signal in an RF transmitter. For example, FIG. 3 is a block diagram illustrating an RF transmitter 50 that includes at least four power amplifiers in accordance with an embodiment. As illustrated, RF transmitter 50 may include: a controller 52; first, second, third, and fourth digital to RF modulators 54, 56, 68, 60; first second, third, and fourth power amplifiers 62, 64, 66, 68; a power combiner 70; and a voltage control unit 72. As before, one or more antennas 32 may be coupled to an output of combiner 70. Voltage control unit 72 may provide variable supply voltages $V_1(t)$, $V_2(t)$, $V_3(t)$, $V_n(t)$ to first, second, third, and fourth power amplifiers 62, 64, 66, 68, respectively, based on one or more control signals from controller 52. First, second, third, and fourth digital to RF modulators 54, 56, 58, 60 provide RF input signals to first, second, third, and fourth power amplifiers 62, 64, 66, 68, respectively based on input information received from controller 52. Combiner 70 combines the output signals of first, second, third, and fourth power amplifiers 62, 64, 66, 68 to generate an RF transmit signal for delivery to antenna(s) 32.

Controller 52 may use any of the control techniques described above in various embodiments. In some implementations, controller 52 may use the voltage control of voltage control unit 72 and the phase and amplitude information delivered to first, second, third, and fourth digital to RF modulators 54, 56, 58, 60 to ensure that transmit data is accurately represented within the RF output signal of combiner 70. In addition, controller 52 may use amplitude information delivered to first, second, third, and fourth digital to RF modulators 64, 56, 58, 60 to control/adjust an output power level of combiner 70 (e.g., a transmit power level, etc.). In some embodiments, this output power control capability may be used to provide power backoff for RF transmitter 50. As in previous embodiments, an energy recovery module 30 may be provided to recover energy at an isolation port of combiner 70 when an isolating combiner architecture is used.

Figure 4:
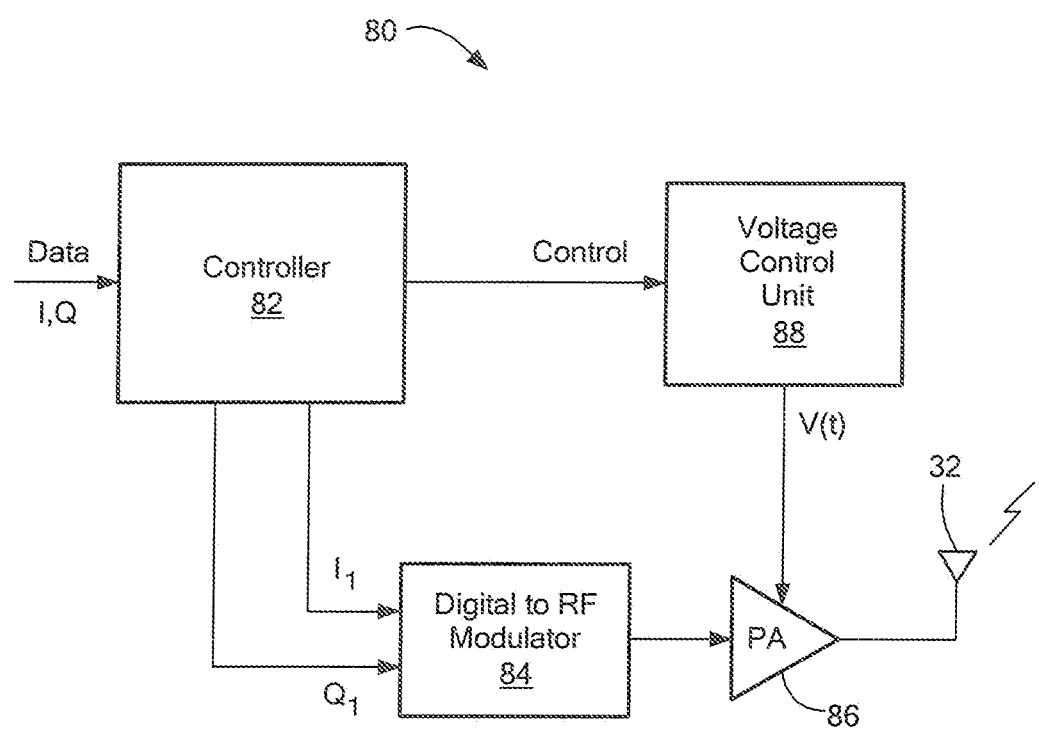
FIG. 4 is a block diagram illustrating an exemplary RF transmitter having a single power amplifier in accordance with an embodiment.

In at least one embodiment, an RF transmitter may be provided that includes a single RF power amplifier. FIG. 4 is a block diagram illustrating an exemplary RF transmitter 80 that includes a single power amplifier in accordance with an embodiment. As shown, RF transmitter 80 includes: a controller 82, a digital to RF modulator 84, a power amplifier 86, and a voltage control unit 88. The output of power amplifier 86 may be coupled to one or more antennas 32 to facilitate the transmission of RF transmit signals to remote wireless entities. Voltage control unit 88 may provide a variable supply voltage V(t) to power amplifier 86 based on a control signal from controller 82. Voltage control unit 88 may be configured to selectively supply one of a plurality of discrete voltages to power amplifier 86, and may supply the discrete voltage to the power amplifier via a transition shaping filter in some implementations. The transition shaping filter may, for example, comprise lossless filter elements, including inductors and capacitors, and may further include lossy elements, such as resistors and magnetic beads. The transition shaping filter serves to provide shaping and/or bandwidth limitation of the voltage transitions between discrete levels and may provide damping of oscillations that might otherwise occur. The transition shaping filter may be selected to provide a low-pass filter response. Discrete voltage supply levels provided by voltage control unit 88 may be predetermined or may be adapted over time based on required average transmit power levels or other factors.

Digital to RF modulator 84 may provide an RF input signal to power amplifier 86 based on input information (e.g., $I_1, Q_1$) received from controller 82. Controller 82 may use any of the control techniques described above in various embodiments. In some implementations, controller 82 may use the voltage control of voltage control unit 88 and the amplitude and phase information delivered to digital to RF modulator 84 to ensure that the transmit data is accurately represented within the RF output signal of RF transmitter 80. Controller 82 may use the amplitude information delivered to digital to RF modulator 84 to control/adjust an output power level of RF transmitter 80 (e.g., a transmit power level). As before, in some implementations, this output power control capability may be used to provide power backoff for RF transmitter 80.

Figure 4A:
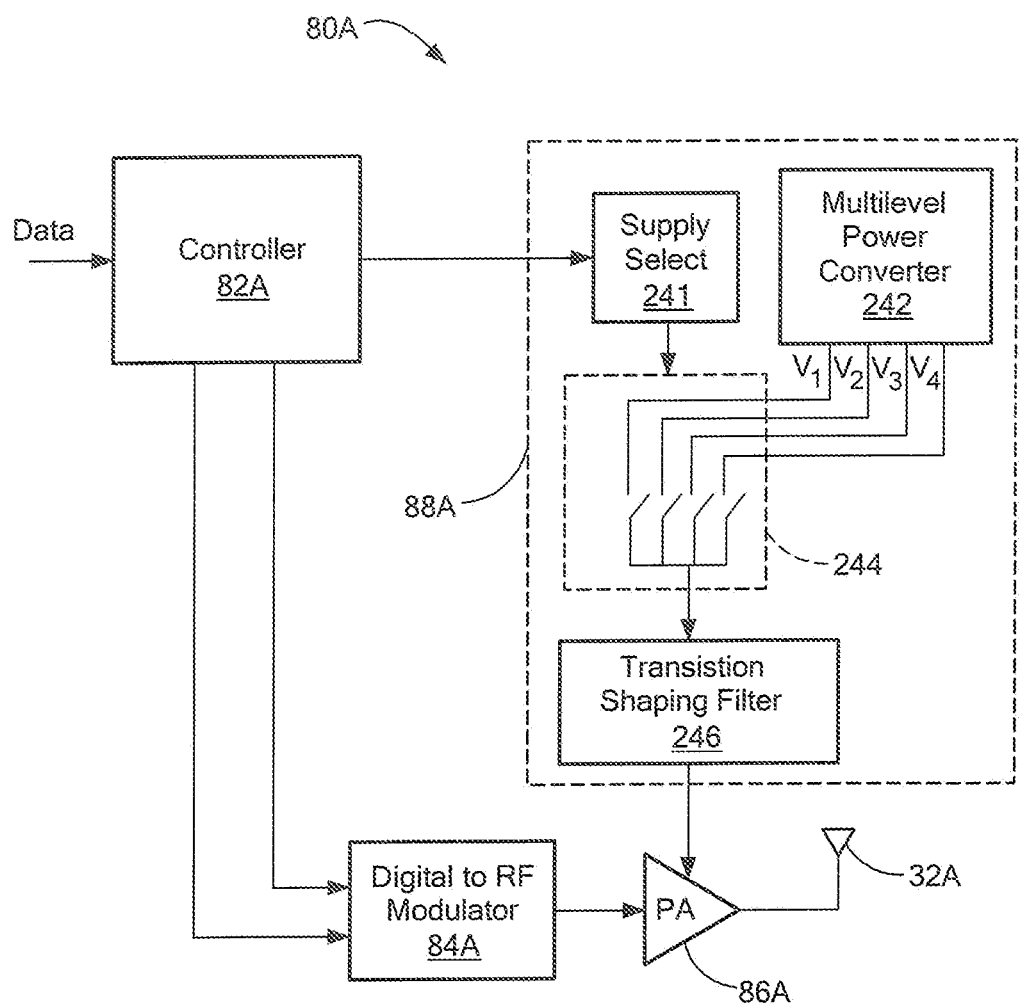
FIG. 4A is a block diagram illustrating an exemplary RF transmitter having a single power amplifier that uses a discrete voltage switching in accordance with an embodiment.

FIG. 4A is a block diagram illustrating an exemplary RF transmitter 80A that includes a single power amplifier in accordance with an embodiment. The RF transmitter 80A is a specific embodiment of the transmitter 80 illustrated in FIG. 4. As shown, RF transmitter 80A includes: a controller 82A, a digital to RF modulator 84A, a power amplifier 86A, and a voltage control unit 88A. The output of power amplifier 86A may be coupled to one or more antennas 32A. Voltage control unit 80A includes: a supply select unit 241, a multilevel power converter 242, a switch unit 244, and a transition shaping filter 246. Multilevel power converter 242 is operative for generating a number of different voltage potentials (i.e., $V_1, V_2, V_3, V_4$) on a plurality of corresponding voltage lines. Although illustrated with four different voltage levels, it should be appreciated that any number of different levels may be used in different embodiments. Switch unit 244 is capable of controllably coupling one of the plurality of voltage lines at a time to a power supply input of power amplifier 86A.

Supply select 241 is operative for switching switch unit 244 between different voltage lines in response to a switch control signal from controller 82A. In at least one embodiment, multilevel power converter 242 may be capable of adapting the voltage value on one or more of the voltage lines slowly over time to, for example, accommodate slow variations in a desired average output power. Transition shaping filter 246 is operative for shaping the transitions between voltage levels within the power amplifier supply voltage signal. In at least one implementation, the transition shaping filter 246 may include a low pass filter.

Figure 4B:
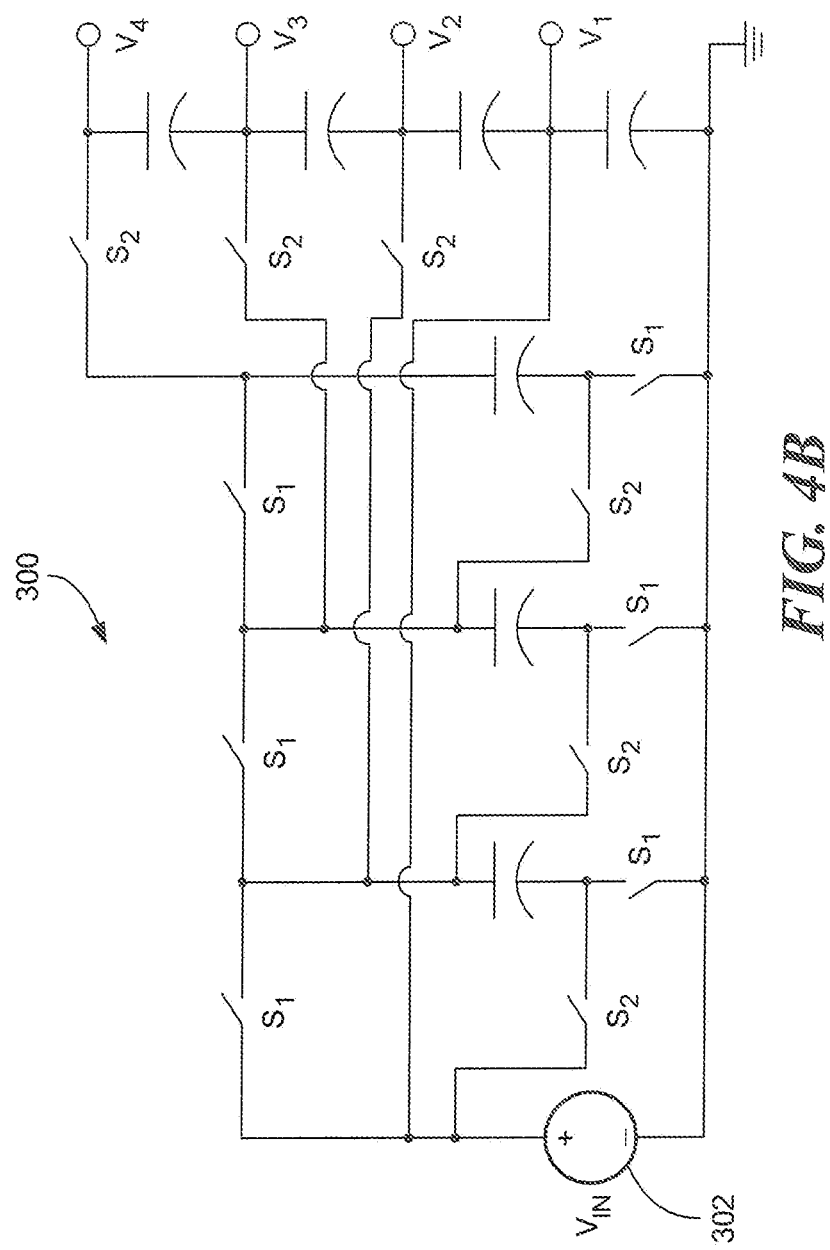
FIG. 4B is a schematic diagram illustrating an exemplary switched capacitor converter circuit that may be used within a voltage control unit in accordance with an embodiment.
Figure 4C:
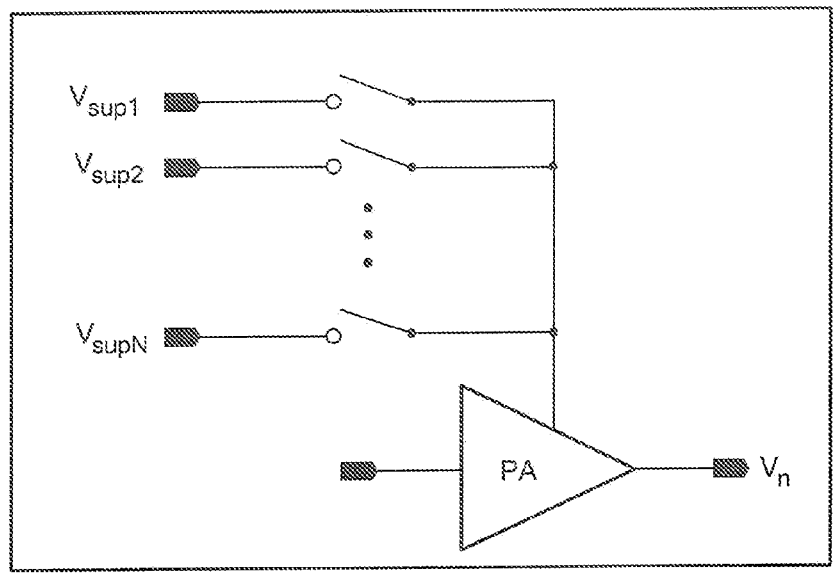
FIG. 4C is a schematic diagram illustrating a voltage control arrangement for switching among different discrete supply levels for a power amplifier in accordance with an embodiment.

As described above, in some implementations, a voltage control unit or voltage control system may include a multi-output (or "multi-level") power converter to generate multiple voltages from a single input voltage. In one approach, a multi-output power converter may be implemented using a switched-capacitor circuit. A switched capacitor converter can provide very high power density for synthesizing multiple ratiometric voltages from a single voltage. FIG. 4B is a schematic diagram illustrating an exemplary switched capacitor converter circuit 300 in accordance with an implementation. The single input of this multiple-output converter may be fed directly from a source voltage or battery 302, or may be fed from another power converter that can adapt the input voltage to the multiple-output converter (and hence the multiple voltages) over time, including, for example, a buck converter, boost converter, and other magnetics-based converters. In some embodiments, a voltage control unit can operate by switching among different discrete supply levels and providing this switched supply directly to the power amplifier, as illustrated in FIG. 4C.

Figure 4D:
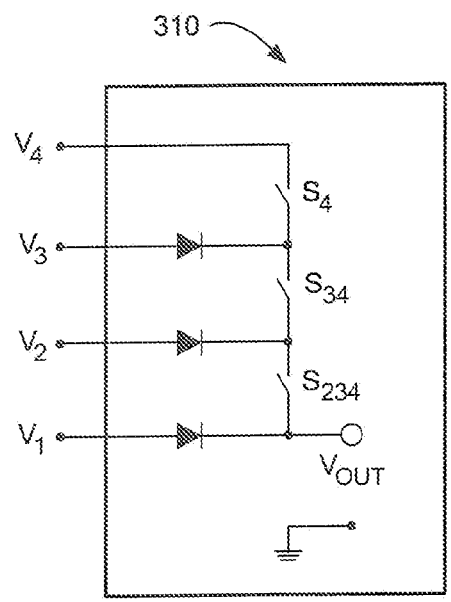
FIGS. 4D and 4E are schematic diagrams illustrating exemplary switching network architectures that may be used in power amplifier systems and RF transmitter systems in accordance with embodiments.
Figure 4E:
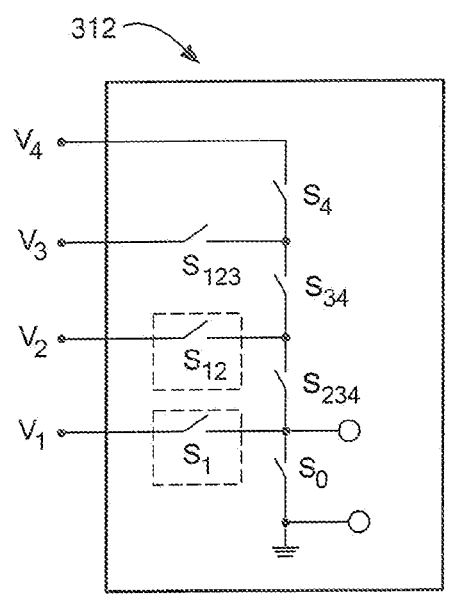
Figure 4F:
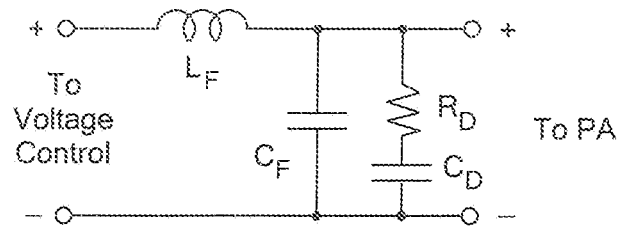
FIGS. 4F-4I are schematic diagrams illustrating exemplary level-transition filter architectures that may be used in various embodiments.
Figure 4G:
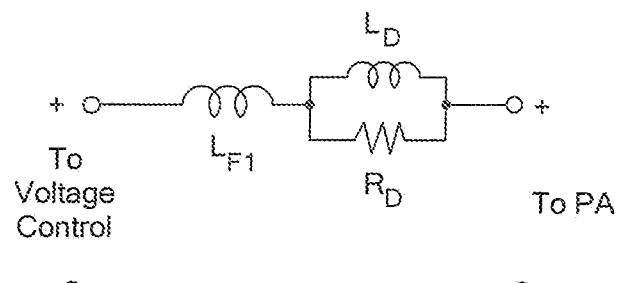
Figure 4H:
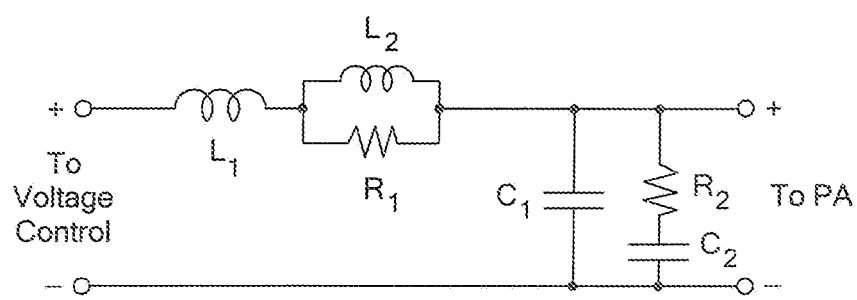
Figure 4I:
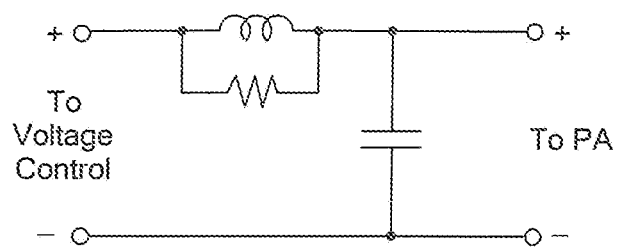

FIGS. 4D and 4E are schematic diagrams illustrating two switching network architectures 310, 312 that may be used in power amplifier systems and RF transmitter systems in accordance with embodiments. These two architectures 310, 312 are both particularly well suited for use in low-power systems implemented in CMOS, but may also be used in other systems. As shown in FIG. 4D, one or more of the switches in switching architecture 310 might be implemented with a diode coupled between the switch and a corresponding voltage level (e.g., between switch $S_{14}$ and voltage $V_3$). As shown FIG. 4E, switching architecture 312 might employ additional switches (e.g., $S_1$, $S_{12}$ and $S_{123}$) to open between a closed switch and an unselected voltage. In some implementations, both a switched-capacitor (SC) circuit and a switching network 310, 312 may be realized together on a single CMOS die. For higher-power systems, it may be advantageous to place a control circuit for switching an SC circuit and/or the switching network on an integrated circuit. It should be appreciated that the switching network architectures 310, 312 of FIGS. 4D and 4E represent two example architectures that may be used in some embodiments. Other switching network architectures may be used in other implementations.

As described above, in some embodiments, a supply voltage with switched discrete levels may be provided to a power amplifier through a transition shaping filter. The filter, which may be low-pass in nature, can limit the high frequency content of the PA supply voltage, provide shaping for the voltage transitions between levels, and provide damping for the transitions. This filter can also incorporate parasitic elements associated with the interconnect of the voltage control unit to the PA, and can be designed such that the frequency content of the supply voltage is matched to what may be adequately adjusted for in the PA drive waveform. FIGS. 4F-4I are schematics illustrating some level-transition filter architectures that may be used in various embodiments. Other filter architectures may alternatively be used.

Figure 5:
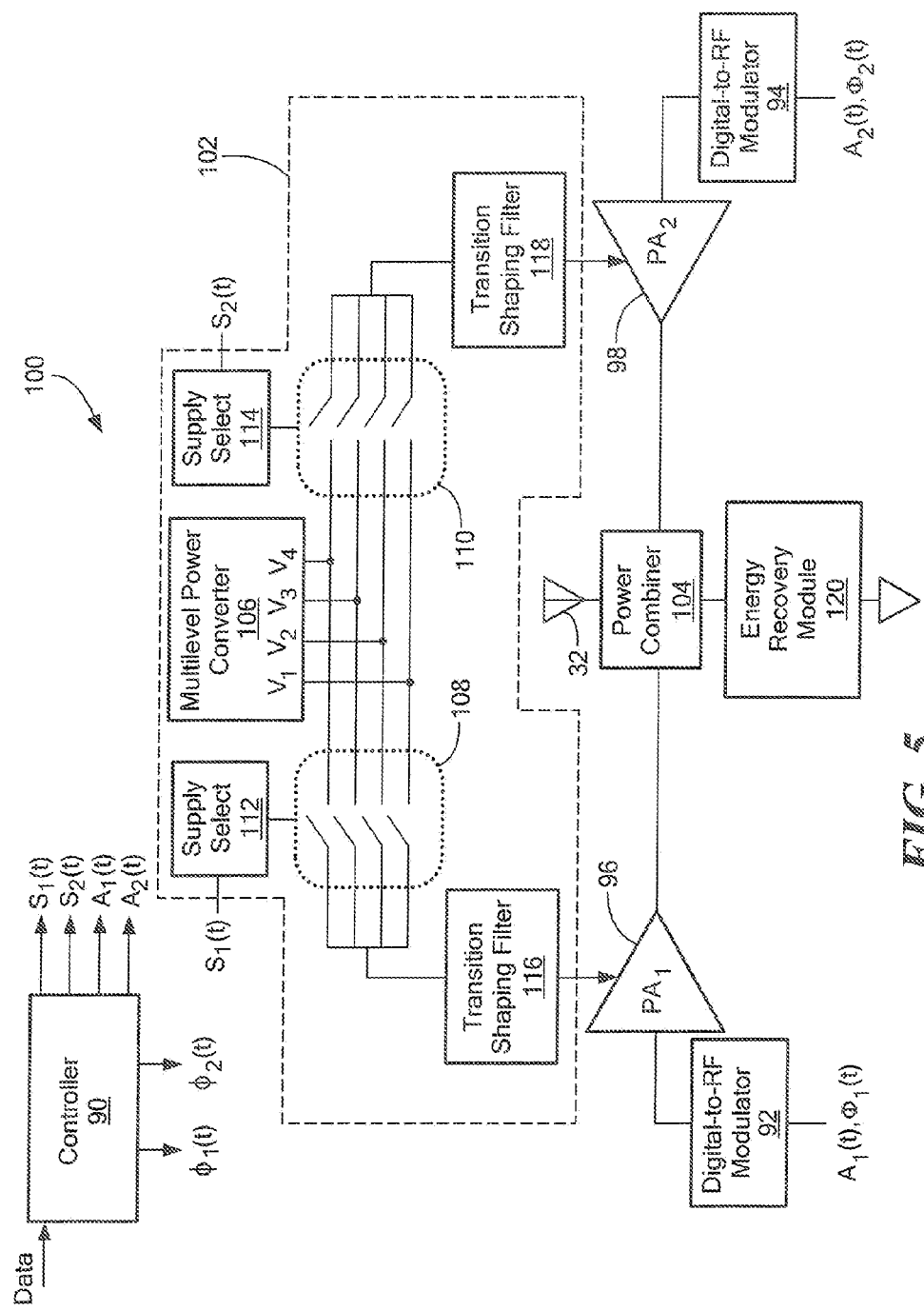
FIG. 5 is a block diagram illustrating an exemplary RF transmitter in accordance with another embodiment.

FIG. 5 is a block diagram illustrating an exemplary RF transmitter 100 in accordance with an embodiment. RF transmitter 100 is a specific implementation of RF transmitter 40 of FIG. 2. As illustrated, RF transmitter 100 includes: a controller 90; first and second digital to RF modulators 92, 94; first and second power amplifiers 96, 98; a voltage control unit 102; a power combiner 104; and an energy recovery module 120. In the illustrated implementation, voltage control unit 102 includes: a multi-level power converter 106; first and second switch units 108, 110; first and second supply selects 112, 114; and first and second transition shaping filters 116, 118. Multi-level power converter 106 is operative for generating a number of different voltage potentials (i.e., $V_1$, $V_2$, $V_3$, $V_4$) on a plurality of corresponding voltage lines. Although illustrated with four different voltage levels, it should be appreciated that any number of different levels may be used in different embodiments. First and second switch units 108, 110 are each capable of controllably coupling one of the plurality of voltage lines at a time to a power supply input of a corresponding power amplifier 96, 98. First and second supply selects 112, 114 are operative for switching the first and second switch units 108, 110 between the different voltage lines in response to switch control signals $S_1(t)$, $S_2(t)$ received from controller 90. In at least one embodiment, multilevel power converter 106 may be capable of adapting the voltage values on the plurality of voltage lines slowly over time to, for example, accommodate slow variations in a desired average output power. First and second transition shaping filters 116, 118 are operative for shaping the transitions between voltage levels within each power amplifier supply voltage signal. In at least one implementation, one or both of the transition shaping filters 116, 118 may include a low pass filter. In some implementations, transition shaping filtration is not used.

As shown in FIG. 5, controller 90 may provide a time varying amplitude value and a time varying phase value to each of the digital to RF modulators 92, 94. That is, controller 90 may provide $A_1(t)$, $\theta_1(t)$ to first digital to RF modulator 92 and $A_2(t)$, $\theta_2(t)$ to second digital to RF modulator 94. As deathbed previously, in some implementations, the amplitude and phase information may be specified using time varying I and Q data (or some other format), rather than amplitude and phase values.

Figure 6:
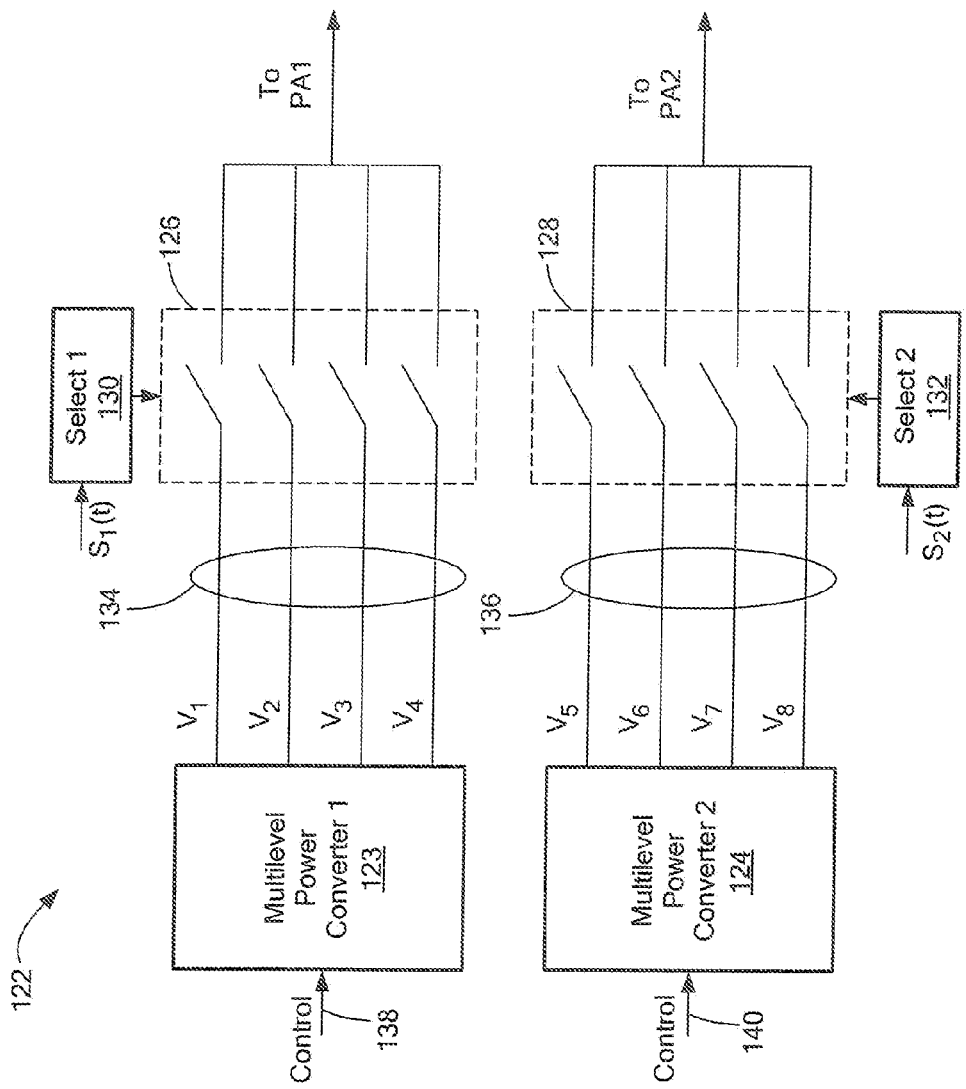
FIG. 6 is a schematic diagram illustrating an exemplary voltage control unit in accordance with an embodiment.

FIG. 6 is a schematic diagram illustrating an exemplary voltage control unit 122 in accordance with an embodiment. As illustrated, voltage control unit 122 may include: first and second multi-level power converters 123, 124; first and second switch units 126, 128; and first and second supply selects 130, 132. First multi-level power converter 123, first switch unit 126, and first supply select 130 may be used to vary a supply voltage of a first power amplifier of an RF transmitter and second multi-level power converter 124, second switch unit 128, and second supply select 132 may be used to vary a supply voltage of a second power amplifier of the RF transmitter. First and second switch units 126, 128 and first and second supply selects 130, 132 may operate in substantially the same manner as the corresponding units described above.

As illustrated in FIG. 6, first multi-level power converter 123 may generate a first plurality of voltage levels (i.e., $V_1$, $V_2$, $V_3$, $V_4$) on a first plurality of voltage lines 134 and second multi-level power converter 124 may generate a second plurality of voltage levels (i.e., $V_5$, $V_6$, $V_7$, $V_8$) on a second plurality of voltage lines 136. In some embodiments, the voltage levels on the first plurality of voltage lines 134 may be the same as the voltage levels on the second plurality of voltage lines 136. In other embodiments, they may be different. As described previously, in some embodiments, different power amplifier designs may be used for the multiple different power amplifiers within an RF transmitter. These different power amplifier designs may require different discrete voltage levels for optimal performance. In the embodiment depicted in FIG. 6, the same number of voltage levels are provided for the first and second power amplifier. In some other embodiments, different numbers of voltage levels may be used for different power amplifiers.

In some implementations, first and second multi-level power converters 123, 124 may each be capable of adapting corresponding output voltage levels over time. As described above, this may be performed to, for example, accommodate slow variations in a desired average output power level. In at least one implementation, first and second multi-level power converters 123, 124 may each include a control input 138, 140 to receive a control signal from a corresponding controller (not shown) indicating when such adaptation is to take place and/or values to use for the new voltage levels.

Figure 7:
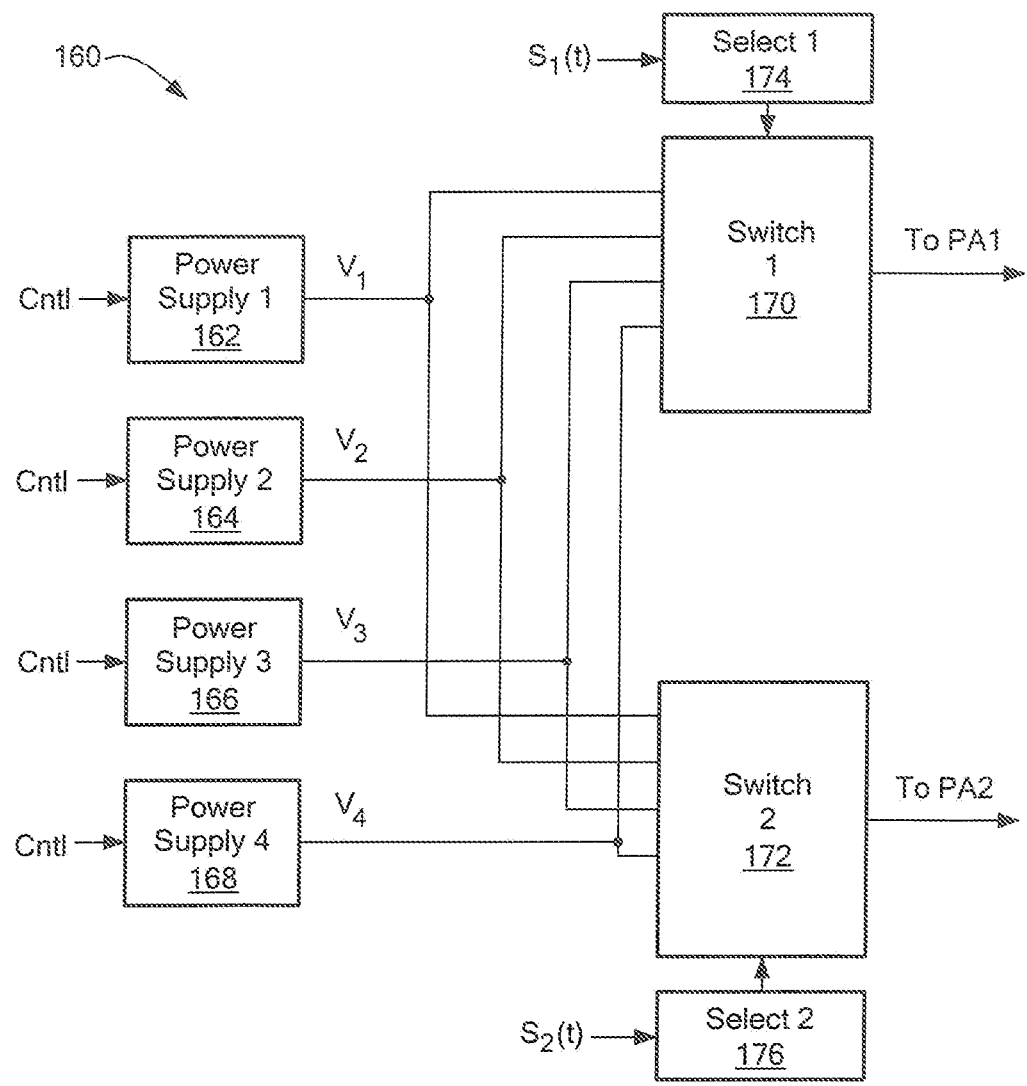
FIG. 7 is a schematic diagram illustrating an exemplary voltage control unit in accordance with another embodiment.

FIG. 7 is a schematic diagram illustrating an exemplary voltage control unit 160 in accordance with an embodiment. As illustrated, voltage control unit 160 may include: first, second, third, and fourth power supplies 162, 164, 168, 170; first and second switch units 170, 172; and first and second supply selects 174, 176. First, second, third, and fourth power supplies 162, 164, 168, 170 may each be operative for generating a unique supply potential on a corresponding output line. First and second switch units 170, 172 may each be capable of controllably coupling one of the supply potentials at a time to a power supply input of a corresponding power amplifier. First and second supply selects 174, 176 are operative for switching the first and second switch units 170, 172 between the different supply potentials in response to switch control signals $S_1(t)$, $S_2(t)$ received from a corresponding controller in some implementations, first, second, third, and fourth power supplies 162, 164, 168, 170 may each adapt its output voltage value slowly over time to, for example, accommodate slow variations in desired average output power level. In at least one embodiment, first, second, third, and fourth power supplies 162, 164, 168, 170 each comprise a battery or are synthesized from a single source using a multi-output switched capacitor converter. Although illustrated with four power supplies 162, 164, 168, 170, it should be appreciated that any number of different power supplies may be used in a particular implementation.

Figure 8:
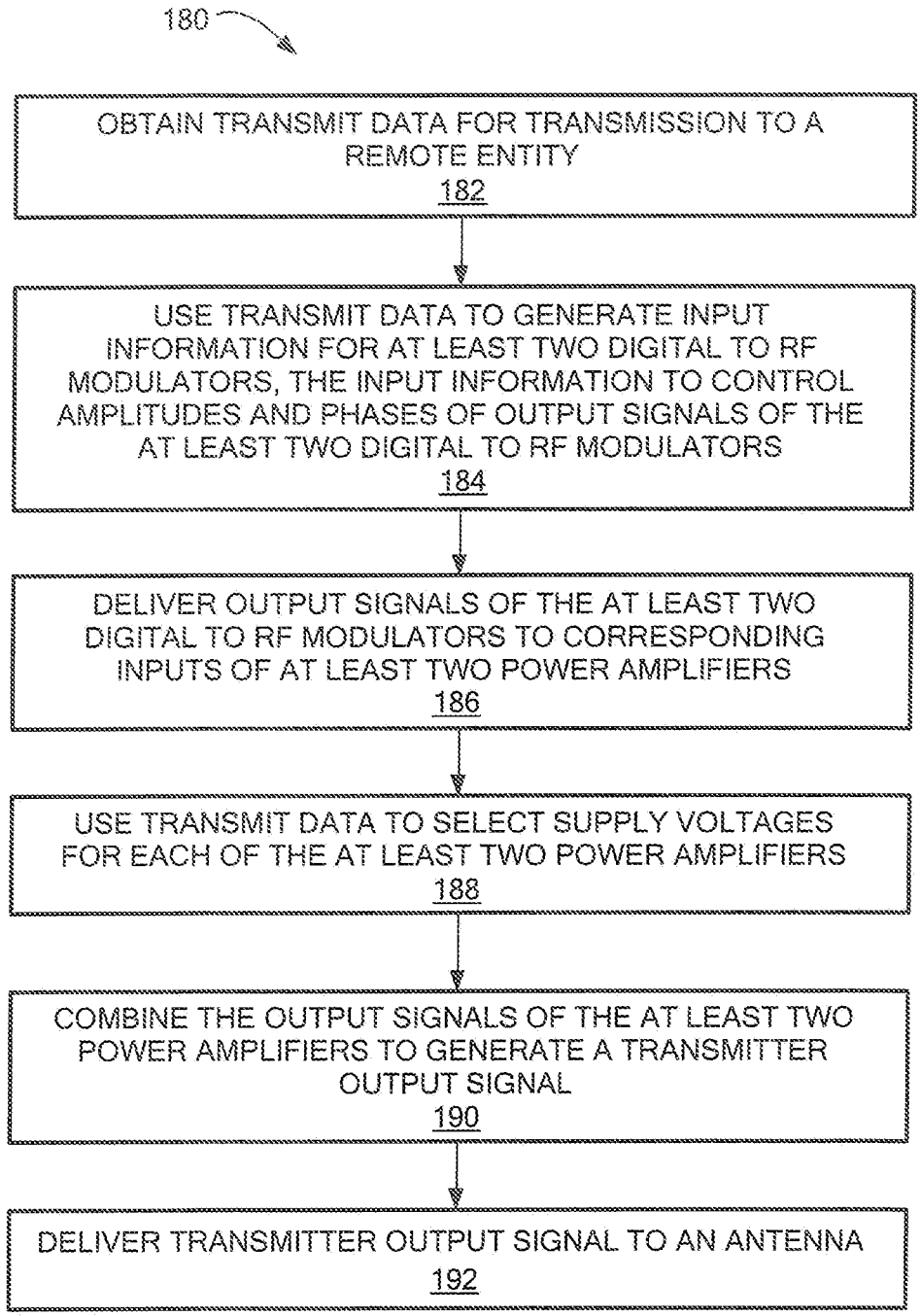
FIG. 8 is a flow diagram illustrating a method for operating an RF transmitter having at least two digital-to-RF modulators driving at least two power amplifiers in accordance with an embodiment.
Figure 9:
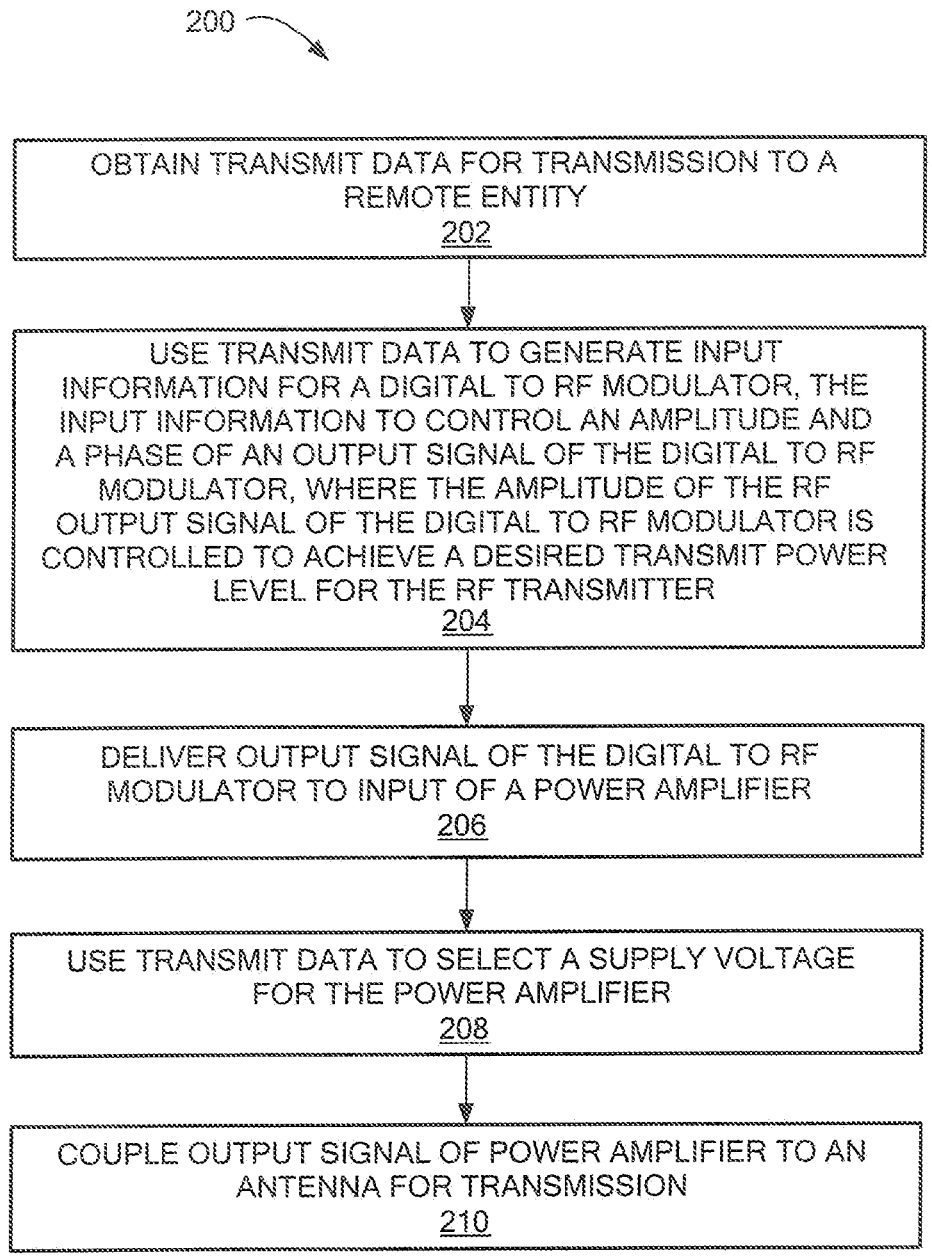
FIG. 9 is a flow diagram illustrating a method for operating an RF transmitter having a single digital-to-RF modulator driving a single power amplifier in accordance with an embodiment.

FIGS. 8 and 9 are flow diagrams illustrating processes for operating RF transmitters in accordance with various embodiments.

The rectangular elements (typified by element 182 in FIG. 8) are herein denoted "processing blocks" and may represent computer software instructions or groups of instructions. It should be noted that the flow diagrams of FIGS. 8 and 9 represent exemplary embodiments of designs described herein and variations in such diagrams, which generally follow the processes outlined, are considered to be within the scope of the concepts, systems, and techniques described and claimed herein.

Alternatively, the processing blocks may represent operations performed by functionally equivalent circuits, such as a digital signal processor circuit, an application specific integrated circuit (ASIC), a field programmable gate array (FPGA), or conventional electrical or electronic systems or circuits. Some processing blocks may be manually performed, while other processing blocks may be performed by circuitry and/or one or more processors. The flow diagrams do not depict the syntax of any particular programming language. Rather, the flow diagrams illustrate the functional information one of ordinary skill in the art may require to fabricate circuits and/or to generate computer software or firmware to perform the corresponding processing. It should be noted that many routine program elements, such as initialization of loops and variables and the use of temporary variables, are not shown. It will be appreciated by those of ordinary skill in the art that unless otherwise indicated herein, the particular sequences described are illustrative only and can be varied without departing from the spirit of the concepts described and/or claimed herein. Thus, unless otherwise stated, the processes described below are unordered meaning that, when possible, the sequences shown in FIGS. 8 and 9 can be performed in any convenient or desirable order.

Referring now to FIG. 8, a method 180 for operating an RF transmitter having at least two digital-to-RF modulators driving at least two power amplifiers will be described. First, transmit data may be obtained that is intended for transmission to one or more remote wireless entities (block 182). The transmit data may be used to provide input information for the at least two digital-to-RF modulators to control amplitudes and phases of output signals of the modulators (block 184). The input information generated for the at least two digital-to-RF modulators may be different for different modulators. The output signals of the at least two digital-to-RF modulators may then be delivered to corresponding inputs of the at least two power amplifiers of the RF transmitter (block 186).

The transmit data may also be used to select supply voltages for each of the at least two power amplifiers (block 188). The output signals of the at least two power amplifiers may be combined to generate a transmitter output signal for the RF transmitter (block 190). Any of the control techniques described herein may be used to generate the input information for the at least two digital-to-RF modulators and to select the supply voltages for the at least two power amplifiers. The transmitter output signal may be delivered to one or more antennas to be transmitted into a wireless channel (block 192). In at least one implementation, the input information generated for each digital-to-RF modulator may be representative of both an amplitude value and a phase value. The amplitude value and the phase value will typically vary with time they can change from sample to sample). In at least one implementation, I and Q values may be provided for each of the at least two digital-to-RF modulators. In some other implementations, time varying amplitude and phase values may be provided. As described above, different input information may be generated for each of the at least two digital-to-RF modulators.

In at least one approach, the amplitude and phase values provided for the at least two digital-to-RF modulators and the supply voltages selected for the at least two power amplifiers may be selected in a manner that results in an accurate representation of the transmit data within the RF output signal of the RF transmitter. The amplitude values generated for the at least two digital-to-RF modulators may be selected to control or adjust an output power level of the RF transmitter in some embodiments. In one approach, the amplitude values may be selected to achieve a desired level of power backoff within the RF transmitter.

FIG. 9 is a flow diagram illustrating a method 200 for operating an RF transmitter having a single digital-to-RF modulator and a single power amplifier. Transmit data is first obtained that is intended for transmission to one or more remote wireless entities (block 202). The transmit data may be used to generate input information for the digital-to-RF modulator to control an amplitude and phase of an output signal of the modulator (block 204). The amplitude of the output signal of the modulator may be controlled in order to achieve a desired transmit power level for the RF transmitter.

The output signal of the digital-to-RF modulator may be delivered to a corresponding input of the power amplifier of the RF transmitter (block 206).

The transmit data may also be used to select a supply voltage for the power amplifier (block 208). Any of the control techniques described herein may be used to generate the input information for the single digital-to-RF modulator and to select the supply voltage for the single power amplifier. The output signal of the power amplifier may be coupled to one or more antennas for transmission into a wireless channel (block 210). In at least one implementation, the input information delivered to the digital-to-RF modulator may be representative of both an amplitude value and a phase value. In at least one approach, the phase value generated for the digital-to-RF modulator and the supply voltage selected for the power amplifier may be selected in a manner that provides an accurate representation of the transmit data at an output of the RF transmitter. The amplitude value generated for the digital-to-RF modulator may be selected to control or adjust an output power level of the RF transmitter. In one approach, this power control capability may be used to achieve a desired level of power backoff for the RF transmitter.

Figure 11:
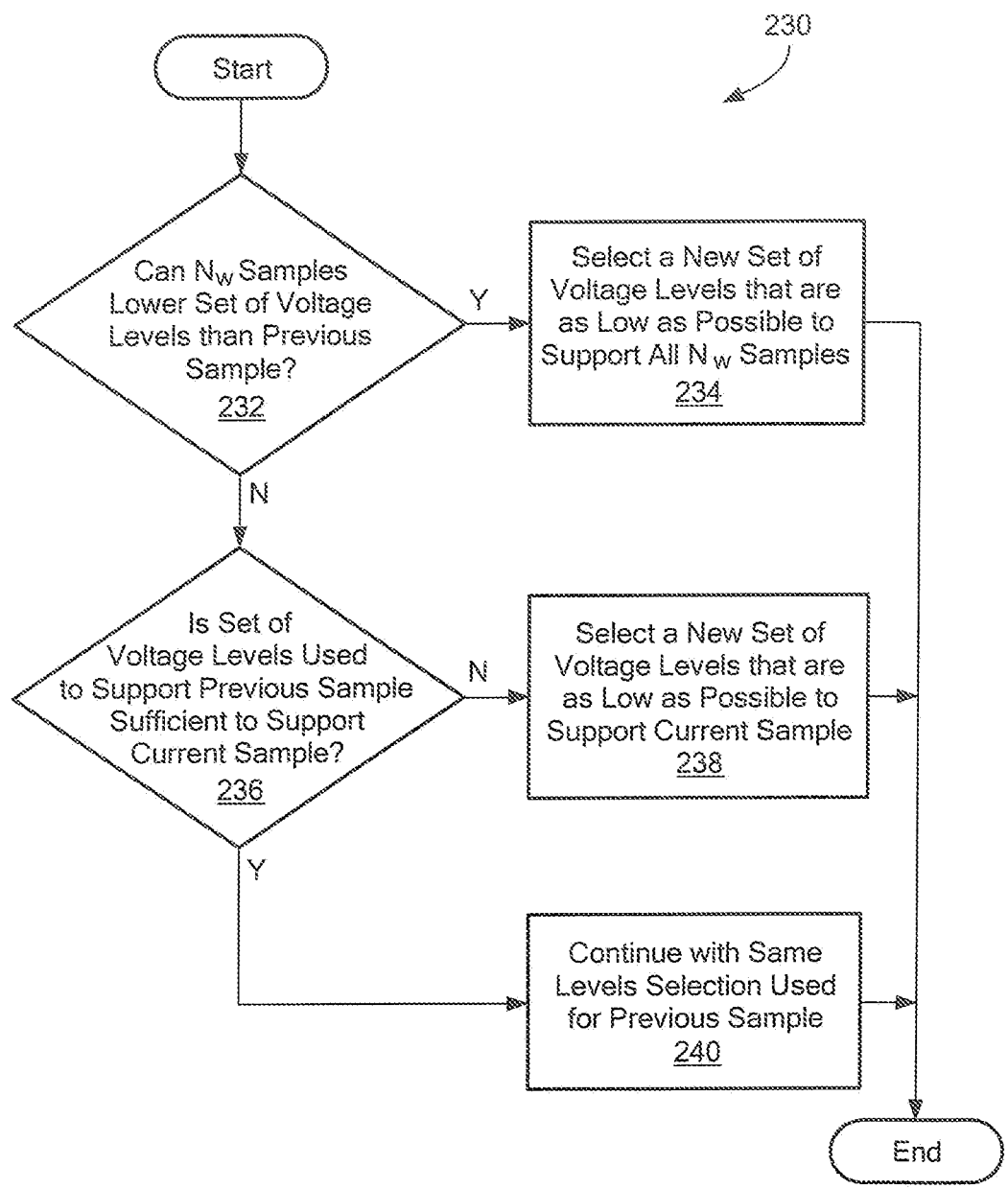
FIG. 11 is a flow diagram illustrating a method for selecting voltage levels for one or more power amplifiers of a power amplification system based on a sample window in accordance with an embodiment.

FIG. 11 is a flow diagram illustrating a method 230 for selecting voltage levels for one or more power amplifiers of a power amplification system based on a window of samples in accordance with an embodiment. As described previously, FIG. 10 is a diagram illustrating such a sample window 220. The method 230 may be used, for example, within the methods 180, 200 of FIGS. 8 and 9 (e.g., in block 188 and block 208, respectively). As shown in FIG. 11, it may first be determined whether $N_W$ current and future samples can use a lower set of voltage levels than a previous sample and still meet output power requirements (block 232). If so (block 232-Y), then a new set of voltage levels may be selected that are as low as possible (or at least lower than the previous sample) to support all $N_W$ current and future samples (block 234). If the $N_W$ samples cannot use a lower set of voltage levels than the previous sample, it may next be determined whether the set of voltage levels used for the previous sample is sufficient to support the current sample (block 236). If not (block 236-N), then a new set of voltage levels may be selected that are as low as possible to support the current sample (block 238). If the set of voltage levels used for the previous sample is sufficient to support the current sample (block 236-Y), then the same level selection may be used for the current sample that was used for the previous sample. This process may be repeated for each new sample.

In the description above, various concepts, circuits, and techniques are discussed in the context of RF transmitters that are operative for transmitting signals via a wireless medium. It should be appreciated that these concepts, circuits, and techniques also have application in other contexts. For example, in some implementations, features described herein may be implemented within transmitters or drivers for use in wireline communications. In some other implementations, features described herein may be implemented within other types of systems that require highly efficient and highly linear power amplification for data carrying signals. In other implementations, features described herein may be applied to systems that require linear power amplification for audio applications, for ultrasonic applications, and in RF power amplification for heating, industrial processing, imaging, and RF power delivery.

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

What is claimed is:

1. A radio frequency (RF) power amplifier system, comprising:
RF power amplifier;
a digital-to-RF modulator to generate an RF input signal for the RF power amplifier based on input information indicative of amplitude values and phase values;
a voltage control unit to provide a variable supply voltage to the RF power amplifier in response to one or more control signals, the variable supply voltage being selected from a plurality of discrete voltage levels; and
a controller configured to;
receive data indicative of a vector to be transmitted from the transmitter;
select a variable supply voltage, an input phase angle and an input amplitude level for the power amplifier that are capable of providing the vector at the output of the power amplifier, wherein the input amplitude level is such that the power amplifier is backed off from a saturation point associated with the voltage level selected for the power amplifier; and
generate the input information based on the input phase angle and the input amplitude level, and generate the one or more control signals based on the selected variable supply voltage; and
provide the input information to the digital-to-RF modulator and the one or more control signals to the voltage control unit;
wherein the voltage control unit includes: an output terminal to provide an output voltage signal, the output terminal being coupled to a supply input of the RF power amplifier; first, second, and third voltage terminals to carry first, second, and third discrete voltage levels in the plurality of discrete voltage levels, respectively; a first switch coupled between the output terminal and the first voltage terminal; a second switch coupled between the output terminal and a first intermediate node; a third switch coupled between the first intermediate node and the second voltage terminal; and a network comprising at least one switch coupled between the first intermediate node and the third voltage terminal; wherein the controller is configured to control states of at least the second switch and the at least one switch.

2. The RF power amplifier system of claim 1, wherein:
the network includes a fourth switch coupled between the first intermediate node and a second intermediate node and a fifth switch coupled between the second intermediate node and the third voltage terminal; and
the voltage control unit further comprises: a fourth voltage terminal to carry a fourth discrete voltage level in the plurality of discrete voltage levels; and a sixth switch coupled between the second intermediate node and the fourth voltage terminal;
wherein the controller is configured to control states of at least the second, fourth, and sixth switches.

3. The RF power amplifier system of claim 1, wherein the voltage control unit further comprises a seventh switch coupled between the output terminal and a ground terminal, wherein the controller is configured to control states of at least the second, seventh and at least one switches.

4. The RF power amplifier system of claim 1, wherein the first and third switches each include a diode.

5. The RF power amplifier system of claim 1, wherein the plurality of discrete voltage levels consists of three voltage levels.

6. The RF power amplifier system of claim 1, wherein the plurality of discrete voltage levels consists of four voltage levels.

7. The RF power amplifier system of claim 1, wherein the controller is configured to make decisions about voltage level changes for the RF power amplifier based, at least in part, on a window of data samples representing data to be output by the RF power amplifier system.

8. The RF power amplifier system of claim 1, wherein the voltage control unit further comprises a low pass transition shaping filter to filter the output voltage signal before it is provided to the RF power amplifier.

9. The RF power amplifier system of claim 8, wherein the low pass transition shaping filter consists essentially of passive components.

10. The RF power amplifier system of claim 1, wherein one or more of the first switch, the second switch, the third switch, and the at least one switch are provided as complementary metal oxide semiconductor (CMOS) technology.

11. The RF power amplifier system of claim 1, wherein the voltage control unit further comprises a switched capacitor converter to synthesize multiple ratiometric voltages from a single input voltage, the switched capacitor converter providing at least some of the discrete voltage levels of the plurality of discrete voltage levels.

12. The RF power amplifier system of claim 1, wherein:
the RF power amplifier is a first RF power amplifier; and
the RF power amplifier system further comprises at least one additional RF power amplifier and a combiner to combine the output signals of the first RF power amplifier and the at least one additional RF power amplifier.

13. The RF power amplifier system of claim 12, further comprising:
a first RF power amplifier, a second RF power amplifier, and a combiner to combine, the output signals of the first RF power amplifier and the second RF power amplifier; and
a second voltage control unit to provide a variable supply voltage to the second RF power amplifier in response to one or more control signals, the variable supply voltage being selected from a plurality of discrete voltage levels.

14. The IF power amplifier system of claim 1, wherein:
the controller is configured to control states of the first switch, the second switch, the third switch, and the at least one switch.

15. A machine implemented method for operating a radio frequency (RF) transmitter having a digital-to-RF modulator driving an RF power amplifier, the method comprising:
obtaining transmit data to be transmitted from the RF transmitter;
providing input information for the digital-to-RF modulator based, at least in part, on the transmit data, the input information to control an amplitude and a phase of an RF output signal of the digital-to-RF modulator;
selecting a supply voltage for the RF power amplifier based, at least in part, on the transmit data, the supply voltage being selected from a plurality of discrete voltage levels, wherein the supply voltage changes with time, the supply voltage selected by the steps of:
selecting a variable supply voltage, an input phase angle and an input amplitude level for the power amplifier that are capable of providing the vector at the output of the power amplifier, wherein the input amplitude level is such that the power amplifier is backed off from a saturation point associated with the voltage level selected for the power amplifier; and generating the input information based on the input phase angle and the input amplitude level, and generate the one or more control signals based on the selected variable supply voltage; and providing control signals to a plurality of switches within a voltage control unit based on the changing supply voltage selection, wherein the voltage control unit includes: an output terminal to provide an output voltage signal, the output terminal being coupled to a supply terminal of the RF power amplifier; first, second, and third voltage terminals to carry first, second, and third discrete voltage levels in the plurality of discrete voltage levels, respectively; a first switch coupled between the output terminal and the first voltage terminal; a second switch coupled between the output terminal and a first intermediate node; a third switch coupled between the first intermediate node and the second voltage terminal; and a network comprising at least one switch coupled between the first intermediate node and the third voltage terminal, wherein providing control signals includes providing control signals to at least the second switch and the at least one switch.

16. The method of claim 15, wherein:
the network includes a fourth switch coupled between the first intermediate node and a second intermediate node and a fifth switch coupled between the second intermediate node and the third voltage terminal; and the voltage control unit further comprises: a fourth voltage terminal to carry a fourth discrete voltage level in the plurality of discrete voltage levels; and a sixth switch coupled between the second intermediate node and the fourth voltage terminal;

wherein providing control signals includes providing control signals to the second, fourth, and sixth switches.

17. The method of claim 16, wherein the voltage control unit further comprises a seventh switch coupled between the output terminal and a ground terminal, wherein providing control signals includes providing control signals to the first, second, third, fourth, fifth, sixth, and seventh switches.

18. The method of claim 15, wherein the first and third switches each include a diode.

19. The method of claim 15, wherein selecting a supply voltage for the RF power amplifier includes selecting a supply voltage from a group of three discrete voltage levels.

20. The method of claim 15, wherein selecting a supply voltage for the RF power amplifier includes selecting the supply voltage from a group of four discrete voltage levels.

21. The method of claim 15, wherein:
selecting a supply voltage, includes selecting the supply voltage based, at least in part, on a window of data samples associated with the transmit data.

22. The method of claim 15, farther comprising:
processing the supply voltage signal in a low pass filter before applying the signal to the RF power amplifier.

23. The method of claim 22, wherein the low pass transition shaping filter consists essentially of passive components.

24. The method of claim 15, wherein:
the RF transmitter includes multiple digital-to-RF modulators driving multiple RF power amplifiers and a combiner to combine output signals of the multiple power amplifiers.

25. The method of claim 15, wherein:
providing control signals includes providing control signals to the first switch, the second switch, the third switch, and the at least one switch.

* * * * *